(12) United States Patent
Bimanand et al.

(10) Patent No.: US 9,545,042 B2
(45) Date of Patent: Jan. 10, 2017

(54) P-STATIC CHARGE DRAIN LAYER INCLUDING CARBON NANOTUBES

(71) Applicant: PPG INDUSTRIES OHIO, INC., Cleveland, OH (US)

(72) Inventors: Alexander Bimanand, Burbank, CA (US); Krishna K. Uprety, Valencia, CA (US); Khushroo H. Lakdawala, Santa Clarita, CA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 14/214,010

(22) Filed: Mar. 14, 2014

(65) Prior Publication Data

US 2015/0264845 A1     Sep. 17, 2015

(51) Int. Cl.
| | |
|---|---|
| *H05K 9/00* | (2006.01) |
| *C09D 175/04* | (2006.01) |
| *C09D 175/06* | (2006.01) |
| *C09D 1/00* | (2006.01) |
| *C09D 5/24* | (2006.01) |
| *C09D 7/12* | (2006.01) |
| *C08K 7/04* | (2006.01) |

(52) U.S. Cl.
CPC .............. *H05K 9/0079* (2013.01); *C09D 1/00* (2013.01); *C09D 5/24* (2013.01); *C09D 7/1291* (2013.01); *C09D 175/04* (2013.01); *C09D 175/06* (2013.01); *C08K 7/04* (2013.01); *Y10T 428/263* (2015.01); *Y10T 428/266* (2015.01); *Y10T 428/269* (2015.01); *Y10T 428/30* (2015.01)

(58) Field of Classification Search
CPC .......... H05K 9/0079; C09D 1/00; C09D 5/24; C09D 7/1291; C09D 175/04; C09D 175/06; C09D 167/00
USPC ................... 977/742, 750; 438/780
See application file for complete search history.

(56) References Cited

U.S. PATENT DOCUMENTS

| | | |
|---|---|---|
| 3,017,386 A | 1/1962 | Brown, Jr. et al. |
| 3,169,945 A | 2/1965 | Young et al. |
| 3,180,781 A | 4/1965 | Ryan et al. |
| 3,995,089 A | 11/1976 | Hartmann et al. |
| 4,173,682 A | 11/1979 | Noomen et al. |

(Continued)

FOREIGN PATENT DOCUMENTS

| | | | |
|---|---|---|---|
| EP | 2128528 A2 | 12/2009 | |
| EP | 2228414 A1 * | 9/2010 | ........... C09D 7/1291 |

(Continued)

OTHER PUBLICATIONS

Zhang, et al.; "A Facile Synthesis of Polypyrrole/Carbon Nanotube Composites with Ultrathin, Uniform and Thickness-Tunable Polypyrrole Shells"; Nanoscale Research Letters; Dec. 1, 2011; 9 Pages.

(Continued)

*Primary Examiner* — Michael Trinh
(74) *Attorney, Agent, or Firm* — Lewis Roca Rothgerber Christie, LLP

(57) ABSTRACT

A coating including a carbon nanotube layer including carbon nanotubes; and a coating layer on the carbon nanotube layer is disclosed. The coating layer may include a polyurethane polymer, a polyacrylate polymer, a polysiloxane polymer, an epoxy polymer, or a combination thereof. A coated substrate including the coating is also disclosed.

19 Claims, 4 Drawing Sheets

(56) References Cited

U.S. PATENT DOCUMENTS

| | | | |
|---|---|---|---|
| 4,234,664 A | 11/1980 | Hendy | |
| 4,442,259 A | 4/1984 | Isgur et al. | |
| 4,465,736 A | 8/1984 | Nishihara et al. | |
| 4,642,263 A | 2/1987 | Culbertson | |
| 5,084,132 A | 1/1992 | Smith | |
| 5,213,828 A | 5/1993 | Winter et al. | |
| 5,378,535 A | 1/1995 | Moncur et al. | |
| 5,472,785 A | 12/1995 | Stobbie, IV et al. | |
| 5,780,160 A | 7/1998 | Allemand et al. | |
| 5,859,722 A | 1/1999 | Suga et al. | |
| 5,939,188 A | 8/1999 | Moncur et al. | |
| 5,982,606 A | 11/1999 | Masuda et al. | |
| 6,213,602 B1 | 4/2001 | Smarto | |
| 6,395,821 B1 | 5/2002 | Shimada et al. | |
| 6,417,292 B1 | 7/2002 | Moriarity et al. | |
| 6,426,125 B1 | 7/2002 | Yang et al. | |
| 6,690,564 B1 | 2/2004 | Haruta et al. | |
| 6,706,801 B1 | 3/2004 | Blum et al. | |
| 6,737,121 B2 | 5/2004 | Yang et al. | |
| 6,933,053 B2 | 8/2005 | Alger | |
| 7,093,307 B1 | 8/2006 | Smith | |
| 7,626,749 B2 | 12/2009 | Baur et al. | |
| 7,636,188 B2 | 12/2009 | Baur et al. | |
| 7,859,738 B2 | 12/2010 | Baur et al. | |
| 7,863,375 B2 | 1/2011 | Baghdachi et al. | |
| 7,923,113 B2 | 4/2011 | Dogan et al. | |
| 8,956,730 B2 * | 2/2015 | Uprety | B64D 7/00 428/172 |
| 2002/0110695 A1 | 8/2002 | Yang et al. | |
| 2003/0054172 A1 | 3/2003 | Savu et al. | |
| 2004/0192835 A1 | 9/2004 | Steidl et al. | |
| 2006/0051592 A1 | 3/2006 | Rawlings et al. | |
| 2006/0052509 A1* | 3/2006 | Saitoh | C09D 5/24 524/496 |
| 2006/0134501 A1 | 6/2006 | Lee et al. | |
| 2006/0274047 A1 | 12/2006 | Spath et al. | |
| 2007/0002421 A1 | 1/2007 | Rukavina et al. | |
| 2007/0021553 A1 | 1/2007 | Lichte et al. | |
| 2007/0029299 A1 | 2/2007 | Prone et al. | |
| 2007/0224340 A1 | 9/2007 | Hatta et al. | |
| 2007/0249088 A1 | 10/2007 | Ohmori et al. | |
| 2008/0073622 A1 | 3/2008 | Housel | |
| 2008/0113200 A1 | 5/2008 | Peng et al. | |
| 2008/0152870 A1 | 6/2008 | Takada et al. | |
| 2008/0176973 A1 | 7/2008 | Qiu et al. | |
| 2008/0212189 A1 | 9/2008 | Baur et al. | |
| 2009/0040306 A1 | 2/2009 | Foote et al. | |
| 2009/0074973 A1 | 3/2009 | Graham et al. | |
| 2009/0080055 A1 | 3/2009 | Baur et al. | |
| 2009/0169870 A1* | 7/2009 | Zheng | C09D 5/24 428/332 |
| 2009/0289235 A1 | 11/2009 | Kniajanski et al. | |
| 2009/0301461 A1 | 12/2009 | Taplan et al. | |
| 2010/0025533 A1 | 2/2010 | Bimanand et al. | |
| 2010/0028684 A1 | 2/2010 | Mariscal et al. | |
| 2010/0065788 A1 | 3/2010 | Momose et al. | |
| 2010/0066519 A1 | 3/2010 | Baur et al. | |
| 2010/0156842 A1 | 6/2010 | Cherif | |
| 2010/0261002 A1 | 10/2010 | Tajima et al. | |
| 2011/0083886 A1 | 4/2011 | Kim | |
| 2011/0147715 A1 | 6/2011 | Rogers et al. | |
| 2011/0217455 A1 | 9/2011 | Veerasamy | |
| 2012/0015098 A1 | 1/2012 | Cheng et al. | |
| 2012/0112133 A1 | 5/2012 | Bahnmüller et al. | |
| 2012/0138589 A1 | 6/2012 | Mitchell et al. | |
| 2012/0328859 A1 | 12/2012 | Uprety et al. | |
| 2014/0093738 A1* | 4/2014 | Bimanand | B64D 7/00 428/425.9 |

FOREIGN PATENT DOCUMENTS

| | | |
|---|---|---|
| WO | WO 98/44015 | 10/1998 |
| WO | WO 00/55389 | 9/2000 |
| WO | WO 2006/000763 A2 | 1/2006 |
| WO | WO 2006/124682 A2 | 11/2006 |
| WO | WO 2007/040352 A1 | 4/2007 |
| WO | WO 2008/068042 A2 | 6/2008 |
| WO | WO 2010/102760 A1 | 9/2010 |
| WO | WO 2010/132858 A2 | 11/2010 |
| WO | WO 2012/138693 A2 | 10/2012 |
| WO | WO 2014/051859 A1 | 4/2014 |
| WO | WO 2014/143389 A1 | 9/2014 |

OTHER PUBLICATIONS

Zhao, et al.; "Effect of silica coating thickness on the thermal conductivity of polyurethane/$SiO_2$ coated multiwalled carbon nanotube composites"; Composites: Part A; Applied Science and Manufacturing; Nov. 21, 2013; 6 Pages.

Extended European Search Report for Application No. 14191665.0 dated Jul. 8, 2015; 8 Pages.

Sibiński, et al.; Carbon nanotube transparent conductive layers for solar cells applications; Optica Applicata; vol. 41, No. 2; pp. 375-381; 2011; 7 pages.

Meng, et al.; Carbon Nanotube Composite Films With Switchable Transparency; ACS Applied Materials & Interfaces; vol. 3; pp. 658-661; 2011; 4 Pages.

Meng, et al; Carbon Nanotube Composite Films With Switchable Transparency; World Journal of Engineering; pp. 789-790; 2 Pages.

Shin, et al.; Elastomeric Conductive Composites Based on Carbon Nanotube Forests; Advanced Materials; vol. 22(24); pp. 2663-2667; 2010; 5 Pages.

Nanowerk; Stretchy and conductive nanotechnology composite for robot skin and strain sensors; Source: http://www.nanowerk.com/spotlight/spotid=16373.php; Date Accessed: Sep. 6, 2013; Webpage.

Flexible Solar Cells with Carbon Nanotubes; SPIE Newsroom: SPIE; Sensing & Measurement Flexible solar cells with carbon nanotubes; Source: http://spie.org/x57669.xml?pf=true&ArticleID=x57669; Date Accessed: Sep. 6, 2013; Webpage.

Xia et al.; Preparation and characterisation of polyurethane grafted single-walled carbon nanotubes and derived polyurethane nanocomposites; Journal of Material Chemistry; vol. 16; pp. 1843-1851; 2006.

International Search Report and Written Opinion dated Sep. 15, 2009 for PCT application No. PCT/US 2009/52009, 11 pages.

International Search Report and Written Opinion dated Sep. 23, 2009 for PCT application No. PCT/US 2009/052015, 11 pages.

The International Search Report and Written Opinion of the International Searching Authority mailed Apr. 29, 2014, for International Application No. PCT/US2014/011255, filed Jan. 13, 2014; 9 Pages.

Berredjem, Y., et al., "On the improvement of the efficiency of organic photovoltaic cells by the presence of an ultra-thin metal layer at the interface organic/ITO," The European Physical Journal Applied Physics, Oct. 24, 2008, vol. 44, p. 223-228.

Cairns, Darran R., et al., "Strain-dependent electrical resistance of tin-doped indium oxide on polymer substrates," Applied Physics Letters, Mar. 13, 2000, vol. 76, No. 11, p. 1425-1427.

Fortunato, Elvira et al., "Influence of the Strain on the Electrical Resistance of Zinc Oxide Doped Thin Film Deposited on Plymer Substrates," Advanced Engineering Materials, May 1, 2002, vol. 4, No. 8, p. 610-612.

Lansaker, P.C., et al., "$TiO_2$/Au/$TiO_2$ multilayer thin films: Novel metal-based transparent conductors for electrochromic devices," Thin Solid Films, 2009, vol. 518, p. 1225-1229.

PCT Search Report and Written Opinion issued in Application No. PCT/US2015/054046, mailed Dec. 22, 2015; 15 pages.

Office Action issued in U.S. Appl. No. 13/843,213, mailed Aug. 1, 2014; 34 pages.

Office Action issued in U.S. Appl. No. 13/843,213, mailed Feb. 10, 2015; 36 pages.

Final Office Action issued in U.S. Appl. No. 13/843,213, mailed Sep. 10, 2015; 31 pages.

Advisory Action issued in U.S. Appl. No. 13/843,213, mailed Nov. 25, 2015; 5 pages.

(56) References Cited

OTHER PUBLICATIONS

Office Action issued in U.S. Appl. No. 13/843,213, mailed Apr. 14, 2016; 23 pages.

* cited by examiner

P-STATIC CHARGE DRAIN LAYER INCLUDING CARBON NANOTUBES

BACKGROUND

Layers capable of draining an electric charge (e.g., a static charge) have a variety of applications. For example, aircraft canopies, and particularly stealth aircraft canopies, may include a layer (or layers) capable of draining an electric charge in order to reduce the buildup of static charge on the canopy (or to prevent such buildup), and to provide radar attenuation. Precipitation static (P-static) and/or lightning strikes can cause an electric charge to buildup on the canopy, which may interfere with electronic equipment in the aircraft. The electric charge can be drained or dissipated by a low resistance layer (or layers) on the canopy, thereby preventing or reducing the buildup of electric charge (e.g., static charge) on the canopy.

The canopy of a modern jet aircraft, such as an F-22 stealth fighter canopy, can be made of a polymer material. While such a polymeric material may have desirable light weight, high strength, and ease of shaping, it might not meet the requirements for stealth aircraft, such as low sheet resistance and the ability to withstand extreme weather conditions. As a result, the canopy may further include coatings (e.g., organic and inorganic coatings) to impart high electrical conductivity and other characteristics to the canopy.

SUMMARY

According to an embodiment of the present disclosure, a coating includes: a carbon nanotube layer including carbon nanotubes; and a coating layer on the carbon nanotube layer. The coating layer may include a polyurethane polymer, a polyacrylate polymer, a polysiloxane polymer, an epoxy polymer, or a combination thereof. The coating layer may include a polyurethane polymer formed from a coating composition including: a hydrophobic first aliphatic polyisocyanate; a second aliphatic polyisocyanate including a hydrophilic portion; a polyester polyol; a hydrophilic polyol; and a fluorinated polyol.

In some embodiments, the carbon nanotubes are single-walled nanotubes.

The coating may have a visible light transmittance of >80%.

In some embodiments, at least a portion of the carbon nanotubes of the carbon nanotube layer are embedded in the coating layer.

In some embodiments, the carbon nanotube layer and the coating layer are separate layers.

The coating layer may have a thickness of about 1 µm to 120 µm.

In some embodiments, the coating layer has thickness of about 2 µm to 90 µm.

The carbon nanotube layer may have a thickness of about 1 nm to 15 nm.

The carbon nanotube layer may be formed from a carbon nanotube coating composition including the carbon nanotubes in an amount of 0.01 wt % to 2 wt % based on the total weight of the carbon nanotube coating composition.

The coating may have a thickness of about 1 µm to 140 µm.

In some embodiments, the carbon nanotube layer consists essentially of carbon nanotubes.

The coating layer may include a conductive agent.

According to embodiments of the present disclosure, a coated substrate includes a substrate and the coating on the substrate.

In some embodiments, the coated substrate further includes a tie layer between the substrate and the coating.

In some embodiments, at least a portion of the coating layer permeates the carbon nanotube layer and is adhered to the tie layer.

The tie layer may include a polyurethane polymer, a polyacrylate polymer, a polysiloxane polymer, an epoxy polymer, or a combination thereof.

The coated substrate may have a visible light transmittance >80%.

A vehicle may include the coated substrate.

BRIEF DESCRIPTION OF THE DRAWINGS

The accompanying drawings, together with the specification, illustrate embodiments of the present disclosure, and, together with the description, serve to explain the principles of the present disclosure.

DETAILED DESCRIPTION

Figure 1:
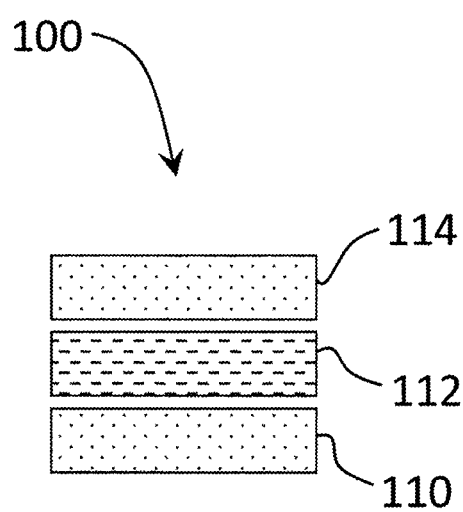
FIG. 1 is an exploded, cross-sectional view of a coated substrate including a coating formed from a coating composition according to an embodiment of the present disclosure.

In the following detailed description, only certain embodiments of the present disclosure are shown and described, by way of illustration. As those skilled in the art would recognize, the disclosure may be embodied in many different forms and should not be construed as being limited to the embodiments set forth herein. Also, in the context of the present application, when a first element is referred to as being "on" or "over" a second element, it can be directly on or over the second element or be indirectly on or over the second element with one or more intervening elements interposed therebetween, and "on" and "over" can each mean "below." For example, a layer that is "on" or "over" another layer can also be considered "below" the other layer, depending upon the point of view. In the drawings, some features, such as the thicknesses of layers and regions, may be magnified or exaggerated for clarity. The present disclosure is not limited to the sizes and thicknesses shown in the drawings. As used herein, the term "plurality" refers to two or more. Like reference numerals designate like elements throughout the specification.

As used herein, the term "coated substrate" or "coated transparency" refers to a substrate or transparency that has been protected (e.g., coated) with one or more layer(s) on the substrate. The substrate and transparency described herein can be made of glass, plastic or other suitable materials, can be coated or uncoated, and can form a canopy, a window or a windshield of a car, aircraft (e.g., an Embraer window or windshield), boat, building, or any other suitable vehicle or structure.

Aspects of embodiments of the present disclosure are directed toward a coating that is sufficiently conductive to drain an electric charge, and is tough, durable and weather resistant, yet still pliable and flexible. In some embodiments, the coating has good adhesion, mechanical and physical integrity, and good environmental durability. The coating described herein can include or be used in combination with any of the layers and/or components described in U.S. Patent Application Publication No. 2010/0028684, the entire content of which is incorporated herein by reference. Aspects of embodiments of the present disclosure are directed toward a coating composition capable of forming a coating providing p-static charge dissipation and having good weatherability and good resistance to acid rain, chemicals (e.g., solvents), salt-fog, abrasion and rain erosion. According to embodiments of the disclosure, the coating can include a carbon nanotube layer including carbon nanotubes, and a coating layer on the carbon nanotube layer. The coating layer can be a topcoat or top layer. The coating layer can include a polyurethane polymer, a polyacrylate polymer, a polysiloxane polymer, an epoxy polymer, or a combination thereof. In some embodiments, the coating layer is formed from a coating composition including a hydrophobic first aliphatic polyisocyanate, a second aliphatic polyisocyanate including a hydrophilic portion, a polyester polyol, a fluorinated polyol and a fluorinated alcohol. The coating (or coating composition) disclosed herein is suitable for aerospace applications.

Carbon nanotubes are also suitable for aerospace applications due to their low weight and cost (as compared to other similarly conductive materials), flexibility, good conductivity, ease of application, good light transmittance, low haze, and good availability. In some embodiments, the carbon nanotubes are included in a coating composition for forming the coating layer prior to the formation of the coating layer. In other embodiments, the carbon nanotubes and the coating composition for forming the coating layer are separately applied to a substrate (e.g., sequentially applied onto the substrate). For example, a carbon nanotube composition may be applied on a substrate (or a tie layer on a substrate) to form the carbon nanotube layer, and a coating composition may be applied on the carbon nanotube layer to form the coating layer. The carbon nanotube composition may include the carbon nanotubes in an amount of 0.01 to 2 wt % based on the total weight of the carbon nanotube composition. The carbon nanotube composition may include carbon nanotubes dispersed in any suitable solvent. Non-limiting examples of the solvent may include water, 1,2-dichlorobenzene (DCB), methanol, ethanol, acetone, isopropanol, propyleneglycol methyl ether, n-methyl-pyrrolidone (NMP) and mixtures thereof, but the present disclosure is not limited thereto. The carbon nanotube composition may further include a surfactant. Non-limiting examples of the surfactant may include sodium dodecyl sulfate (SDS), sodium cholate (SC), sodium deoxycholate (SDOC) and mixtures thereof, but the present disclosure is not limited thereto. The carbon nanotube composition may include the surfactant in an amount of 0.5 wt % to 5 wt % based on the total weight of the carbon nanotube composition.

The coating composition for forming the coating layer can be reacted to form a polyurethane polymer. Thus, as described herein, the coating can include the various components of the coating composition in their reacted or unreacted forms, for example, the hydrophobic first aliphatic isocyanate and polyester polyol can be included in the coating in their reacted forms (e.g., as segments of an oligomer or polymer that includes a urethane or carbamate polymer linkage).

The coating can include the coating layer (e.g., the polyurethane polymer) on the carbon nanotubes. For example, the carbon nanotubes can be encapsulated between the coating layer and a tie layer. The tie layer can include a polyurethane polymer, a polyacrylate polymer, a polysiloxane polymer, an epoxy polymer, or a combination thereof. For example, the tie layer can have a composition that is the same as that of the first or second tie layer of U.S. Patent Application Publication No. 2010/0028684. In some embodiments, the tie layer is formed from the coating composition including the hydrophobic first aliphatic polyisocyanate, the second aliphatic polyisocyanate including the hydrophilic portion, the polyester polyol, the fluorinated polyol and the fluorinated alcohol. In some embodiments, the coating includes the coating layer in a distinct (or discrete) layer on the carbon nanotubes (e.g., the coating layer and the carbon nanotubes are present in the coating as distinct layers). In other embodiments, the carbon nanotubes are embedded (or partially embedded) in the coating layer. The coating may further include an additional layer including the polyurethane polymer on the carbon nanotubes embedded (or partially embedded) in the coating layer. In some embodiments, the carbon nanotube layer is a distinct (or separate) layer between the coating layer and the tie layer. In other embodiments, at least a portion of the coating layer permeates the carbon nanotube layer and is adhered to the tie layer.

For example, a coated substrate 100 (e.g., a coated transparency) including the coating is shown in FIG. 1. As can be seen in the embodiment shown in FIG. 1, the coated substrate includes a substrate 110, a tie layer 112 and a coating 114. The coating includes the carbon nanotube layer and the coating layer on the carbon nanotube layer. In some embodiments, the coating layer permeates the carbon nanotube layer and is adhered to the tie layer 112. In other embodiments, the tie layer 112 is omitted and the coating 114 is directly on the substrate 110. In some embodiments, the coating layer is formed from the coating composition described herein (e.g., the coating layer includes the polyurethane polymer described herein), and the carbon nanotubes are encapsulated in the coating layer. The compositions of the components of the coated substrates described herein are described in more detail below.

Figure 2:
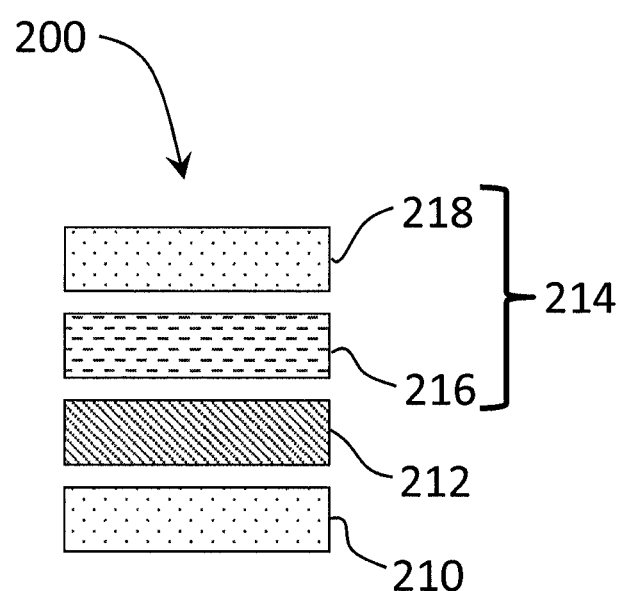
FIG. 2 is an exploded, cross-sectional view of a coated substrate according to another embodiment of the present disclosure.

In other embodiments, the coating can include separate and distinct layers. For example, in the embodiment shown in FIG. 2, a coated substrate 200 includes a substrate 210, a tie layer 212 and a coating 214. In this embodiment, the coating 214 includes a carbon nanotube layer 216 and a coating layer 218. The coating layer 218 may include a polyurethane polymer, a polyacrylate polymer, a polysiloxane polymer, an epoxy polymer, or a combination thereof. For example, the coating layer 218 may be formed from the coating composition described herein and may include the polyurethane polymer, and it may include other suitable additives (e.g., a conductive agent, such as those described in U.S. Patent Application Publication No. 2010/0028684.). The carbon nanotube layer 216 may include carbon nanotubes as described herein. In some embodiments, the carbon nanotube layer 216 further includes other suitable additives (e.g., a conductive agent, such as those described in U.S. Patent Application Publication No. 2010/0028684). In other embodiments, the carbon nanotube layer 216 consists essentially of carbon nanotubes. As used herein and in the claims that follow, the term "consisting essentially of carbon nanotubes" means that the layer primarily contains carbon nanotubes, but can contain other substances that do not affect the conductivity, density, flexibility, light transmission, durability, sheet resistance, and/or p-static charge drain properties of the carbon nanotubes (or the layer including the carbon nanotubes).

Figure 3:
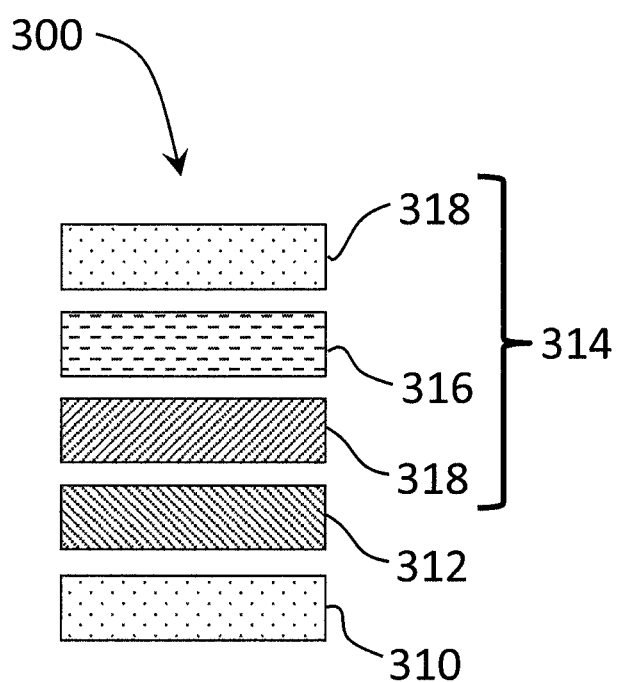
FIG. 3 is an exploded, cross-sectional view of a coated substrate according to yet another embodiment of the present disclosure.

The coating can also include a plurality of coating layers. For example, in the embodiment shown in FIG. 3, a coated substrate 300 includes a substrate 310, a tie layer 312 and a coating 314. The tie layer 312 may have a composition that is the same as that of any of the tie layers of U.S. Patent Application Publication No. 2010/0028684. In the embodiment shown in FIG. 3, the coating 314 includes coating layers 318 and a carbon nanotube layer 316 between the coating layers 318. The coating layers 318 may have a composition as described above with respect to FIGS. 1 and 2. The coating layer 318 over the carbon nanotube layer 316 may further include other suitable additives (e.g., a conductive agent, such as those described in U.S. Patent Application Publication No. 2010/0028684), while the coating layer below the carbon nanotube layer 316 may be substantially free (or completely free) of a conductive agent. For example, including a conductive agent in the coating layer below the carbon nanotube layer 316 may decrease the resiliency of the coating. In some embodiments, the coating layer 318 below the carbon nanotube layer 316 is dielectric or electrically non-conductive (electrically insulating). The carbon nanotube layer 316 may be substantially the same as the carbon nanotube layer 216 described above with respect to FIGS. 1 and 2 and, therefore, further description of that layer will not be provided here.

Figure 4:
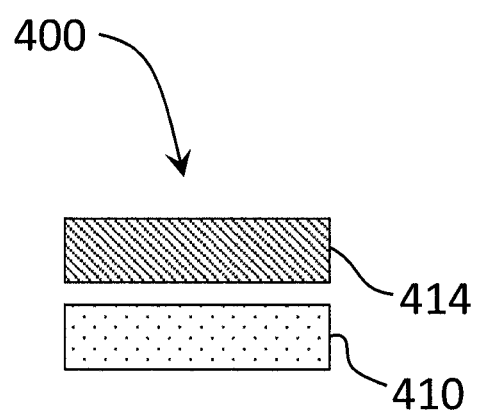
FIG. 4 is an exploded, cross-sectional view of a coated substrate according to yet another embodiment of the present disclosure.

In some embodiments, the tie layer can be omitted and the coating can be directly on the substrate. For example, in the embodiment shown in FIG. 4, a coated substrate 400 includes a substrate 410 and a coating 414 directly on the substrate 410. The coating 414 may be substantially the same as any of the coatings described above and, therefore, further description of the coating will not be provided here.

Any of the coated substrates described above can be used as a windshield, window, or canopy of a vehicle. "Vehicle" is used herein in its broadest sense and includes all types of vehicles, such as but not limited to cars, trucks, buses, vans, boats, heavy duty equipment, airplanes, golf carts, motorcycles, bicycles, railroad cars and the like. For example, the vehicle can include aerospace vehicles (e.g., airplanes), including, but not limited to, large commercial and freight airplanes, helicopters, rockets, and other spacecraft, but the present disclosure is not limited thereto. For example, the coated substrates can also be used as a window or windshield of a building, or any other suitable vehicle or structure. In the case of a modern aircraft canopy, the substrate is typically an organic resin, such as polycarbonate or polyacrylate, but the present disclosure is not limited thereto. Additionally, it is understood that the present disclosure is not limited to the configurations shown in FIGS. 1-4, and there can be one or more intervening layers or features on, under or between the features shown in FIGS. 1-4. The compositions of the components of the coated substrates will now be described in more detail.

In some embodiments, the coating described herein is used in combination with any of the layers and/or components described in U.S. Patent Application Publication No. 2010/0028684. For example, the coating described herein can be used to replace the second tie layer and/or top layer described in U.S. Patent Application Publication No. 2010/0028684. Thus, the coating layer described herein may be used in combination with any or all of the multilayer stack, tie layers (e.g., first and second tie layers), barrier layer, or top layer described in U.S. Patent Application Publication No. 2010/0028684. The coating layer described herein may have a thickness of about 1 µm to 120 µm, for example, about 2 µm to 90 µm, or about 50 to 70 µm. The coating, which includes the coating layer, may have a thickness of about 1 µm to 140 µm, for example, about 2 µm to 100 µm.

In some embodiments of the present disclosure, bare (e.g., naked) carbon nanotubes are sprayed over a thick, resilient tie layer on a primed metal to form a charge drain layer. The carbon nanotubes can be encapsulated between the tie layer and the coating layer with the coating layer penetrating through holes of the carbon nanotubes and/or penetrating between the carbon nanotubes to anchor (or adhere) the coating layer to the tie layer. The tie layer may be a very resilient, rubber-like polyurethane coating having low $T_g$ that can act as a liner, for example, in combination with the coating layer, and protect layers under the tie layer from moisture and the outside environment. Thus, in some embodiments a coated substrate including the coating and tie layer may or may not include a barrier layer as described in U.S. Patent Application Publication No. 2010/0028684. The tie layer does not need to be electrically conductive and may be dielectric. In some embodiments, including a conductive agent in the tie layer decreases the resiliency of the coating, thereby reducing the rain erosion resistance of the coating. Thus, in some embodiments the tie layer is dielectric or electrically non-conductive (electrically insulating).

The carbon nanotubes included in embodiments of the coating (or the coating composition) can be any suitable carbon nanotubes. For example, in some embodiments, the carbon nanotubes are single-walled carbon nanotubes, multi-walled carbon nanotubes, or a combination thereof. The single-walled carbon nanotubes may provide better light transmission than the multi-walled carbon nanotubes, which may adversely affect light transmittance through the coating. In some embodiments, the coating (or coating composition) includes single-walled carbon nanotubes and is substantially free of multi-walled carbon nanotubes. As used herein, the term "substantially" is used as a term of approximation and not a term of degree, such that the term "substantially free" means that the material being discussed is present in the coating composition (or coating), if at all, as an incidental impurity. As used herein, the term "completely free" means that the material is not present in the coating composition (or coating) at all. In some embodiments, the carbon nanotubes are single-walled carbon nanotubes. The carbon nanotubes may have a diameter of about 0.5 to 5 nm, for example, about 0.5 to 1 nm, or 0.8 nm (e.g., 0.84 nm). The carbon nanotubes may have a length of about 300 to 800 nm, for example, 500 to 800 nm, or 790 nm.

The carbon nanotubes can be applied to the substrate by any suitable method, such as spraying or flow coating, but the present disclosure is not limited thereto. For example, the carbon nanotubes can be dispersed in a solvent and sprayed onto the substrate, tie layer and/or basecoat layer. The solvent may be any suitable solvent, for example, 1,2-dichlorobenzene (DCB), methanol, ethanol, acetone, isopropanol, propyleneglycol methyl ether, n-methylpyrrolidone (NMP), or mixtures thereof, but the present disclosure is not limited thereto. For example, the carbon nanotubes may be dispersed in the solvents described herein, and sprayed onto the substrate, tie layer and/or basecoat layer. Surfactants may also be used to stabilize the dispersion of carbon nanotubes in the solvent. Examples of the surfactant include sodium dodecyl sulfate (SDS), sodium cholate (SC), sodium deoxycholate (SDOC), and mixtures thereof, but the surfactant is not limited thereto.

The coating may include the carbon nanotubes in a layer (e.g., the carbon nanotube layer or the coating) having a thickness of about 1 to 15 nm, for example, 5 nm to 10 nm. For example, the layer including the carbon nanotubes may have a thickness of 7 nm. In some embodiments, the layer including the carbon nanotubes is conductive and is capable of draining an electric charge (e.g., a p-static charge). For example, the coating including the layer including the carbon nanotubes may have a sheet resistance of about 400 to 1000Ω/□. The carbon nanotubes may be deposited from a carbon nanotube coating composition including the carbon nanotubes in an amount of about 0.01 wt % to 2 wt % based on the total weight of the coating composition.

The tie layer can be any suitable organic layer. For example, when the substrate is a polyacrylate, polycarbonate, or similar organic resin, the tie layer can include an acrylate (e.g., an acrylic polymer or mixture of polymers). For example, the tie layer can include an acrylic polymer polymerized from one or more alkyl acrylates and/or methacrylates. Optionally, the tie layer can also include one or more additional adhesion promoters, such as additional monomers. The tie layer can be applied to the substrate by gravity coating or another suitable application technique. In gravity coating, a polymeric solution of the tie layer polymer (s) or precursor monomers is prepared, and the polymeric solution is then discharged from a nozzle and poured over the substrate and allowed to flow over the substrate. The solution may be applied slowly from one end to another of the substrate, until the entire substrate is coated with a tie layer. The thickness of the tie layer can be controlled by, for example, controlling the viscosity of the polymeric solution. The liquid coating can be applied by multiple passes to ensure a consistent layer is formed across the substrate. Any excess drips off the substrate are collected at the bottom, through a gutter, where they can be properly disposed of and/or re-used.

In another embodiment, multiple streams of the polymeric solution are directed to impinge on the substrate. The solution streams are ejected through one or more nozzles or other outlets at a constant flow rate. By keeping the flow rate of the polymeric solution constant, the thickness of the tie layer can be controlled. In addition to the flow rate, the thickness of the tie layer also depends on the viscosity of the polymeric solution. Increasing the viscosity of the polymeric solution increases the thickness of the tie coating. In some embodiments, the viscosity of the polymeric solution is in a range of about 2 to about 200 centipoise. Once the substrate is coated with the tie layer material(s), it is air dried under atmospheric conditions and ambient temperatures, and then cured using heat or ultraviolet light. After the tie layer is applied to the substrate and cured, the coating can be formed on the tie layer. The tie layer may have a composition that is the same as that of any of the tie layers of U.S. Patent Application Publication No. 2010/0028684

The coating composition for forming the coating layer (e.g., the polyurethane polymer of the coating) will now be described in more detail. A variety of isocyanates and polyisocyanates (such as difunctional, polyfunctional, aromatic, aliphatic, monomeric and oligomeric isocyanates) can be used in coating compositions for forming polyurethane coatings. Aliphatic isocyanates have good hydrolytic stability and UV resistance. Non-limiting examples of monomeric aliphatic diisocyanates include hexamethylene diisocyanate, methylene bis-(4-cyclohexylisocyanate), and isophorone diisocyanate. Monomeric aliphatic diisocyanates can be used to prepare polyisocyanate adducts, prepolymers and thermoplastic polyurethanes ("TPUs"). For example, monomeric aliphatic diisocyanates can be used to prepare biuret-based polyisocyanates (e.g., polyisocyanates including the —(HN—CO—)$_2$N— functional group), isocyanurate ring-based polyisocyanates (e.g., isophorone diisocyanate trimers), and other oligomers of polyisocyanates. More specifically, hexamethylene diisocyanate (HDI) can be used to prepare the HDI-based biuret shown in Structure 1 below or the HDI-based trimer including an isocyanurate ring shown in Structure 2 below. Isophorone diisocyanate (IPDI) can be used to prepare the IPDI-based trimer shown in Structure 3 below, which is an isocyanurate ring-based polyisocyanate. HDI trimers including an isocyanurate ring have much lower viscosity than HDI-based biurets. IPDI trimers have lower reactivity than HDI trimers.

[Structure 1]

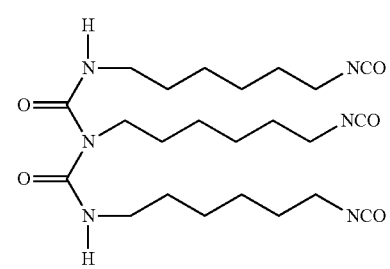

[Structure 2]

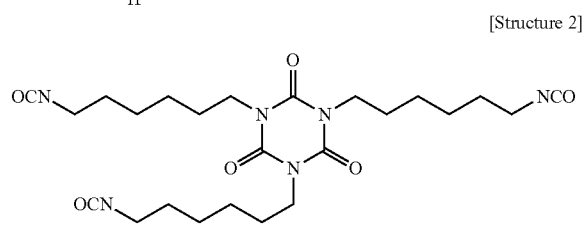

[Structure 3]

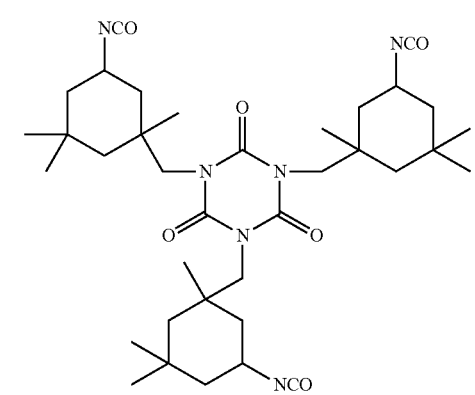

According to embodiments of the present disclosure, the first aliphatic polyisocyanate can be one or more of a biuret-based polyisocyanate, an isocyanurate ring-based polyisocyanate, or an isophorone diisocyanate oligomer. For example, the first aliphatic polyisocyanate can include one or more of the HDI-based biuret shown in Structure 1 above (or a derivative thereof), the HDI-based trimer including an isocyanurate ring shown in Structure 2 above (or a derivative thereof), or the IPDI-based trimer shown in Structure 3 above (or a derivative thereof). Non-limiting commercially available examples of the first aliphatic polyisocyanate (or mixtures including the first aliphatic polyisocyanate) include methylene bis-(4-cyclohexylisocyanate) (e.g., DESMO- DUR® W), methylene 1,6-hexamethylene diisocyanate-based polyisocyanates (e.g., DESMODUR® N-75, DESMODUR® N-100, DESMODUR® N-3200, DESMODUR® N-3300, DESMODUR® N-3600, and DESMODUR® N-3790) and isophorone diisocyanate-based polyisocyanates (e.g., DESMODUR® Z-4470) (each available from Bayer Material Science). DESMODUR® is a registered trademark of Bayer Material Science, Leverkusen, Germany. Some of the foregoing examples include an aliphatic polyisocyanate dispersed in (or diluted with) a solvent, which reduces the viscosity of the polyisocyanate, thereby improving ease of handling the first aliphatic polyisocyanate.

The first aliphatic isocyanate can have a functionality of 3 or more (e.g., have 3 or more isocyanate functional groups). In some embodiments, the first aliphatic polyisocyanate has an isocyanate functionality in a range of 3.0 to 4.2. For example, the first aliphatic polyisocyanate can have an isocyanate functionality of about 3.2, 3.5, 3.8 or 4.1. In some embodiments, for example, the first aliphatic polyisocyanate can have an isocyanate functionality of about 3.8

According to embodiments of the present disclosure, a coating composition including the first aliphatic polyisocyanate described herein (e.g., an HDI biuret-based polyisocyanate) is capable of forming an elastic coating (or film) having good low temperature flexibility, thereby providing resistance to rain erosion that is not achieved with other polyisocyanates. The coating or coating layer may also have good weatherability and mechanical strength. Some examples of the coating composition including an HDI biuret-based polyisocyanate formed a coating having good durability, but reduced resistance to rain erosion. Some examples of the coating composition including an isocyanurate ring-based polyisocyanate (e.g., an HDI trimer-based polyisocyanate) formed a coating having good resistance to rain erosion, but reduced chemical (e.g., solvent) resistance. Some examples of the coating composition including an isocyanurate ring-based polyisocyanate formed a coating having a relatively short tack-free time and good chemical resistance, but, due to the high $T_g$ of the isocyanurate ring-based polyisocyanate (~60° C.), the resultant coating was rigid and had poor resistance to rain erosion. In comparison, the $T_g$ of some HDI biuret-based polyisocyanates (e.g., DESMODUR® N-75 and DESMODUR® N-100) is about −60° C.

According to embodiments of the disclosure, the coating composition further includes a second aliphatic polyisocyanate including a hydrophilic portion. The hydrophilic portion of the second aliphatic polyisocyanate can include a polyether chain. In some embodiments, the second aliphatic polyisocyanate further includes a hydrophobic portion. The hydrophobic portion of the second aliphatic isocyanate can include an isophorone diisocyanate moiety or a derivative thereof. Non-limiting, commercially available examples of the second aliphatic polyisocyanate (or mixtures including the second aliphatic polyisocyanate) include polyether modified HDI trimer-based polyisocyanates (e.g., BAYHYDUR® 302 and BAYHYDUR® 303), polyether modified HDI allophonate-based polyisocyanates (e.g., BAYHYDUR® 304, and/or BAYHYDUR® 305), isophorone diisocyanate-based hydrophilically modified aliphatic polyisocyanate (e.g., polyether modified isophorone diisocyanate trimer, such as BAYHYDUR® 2150BA and/or BAYHYDUR® 401-70), ionic aminosulfonic acid modified HDI polyisocyanates (e.g., BAYHYDUR® XP2547, BAYHYDUR® XP2487/1, and/or BAYHYDUR® XP 2655) (each available from Bayer Material Science). BAYHYDUR® is a registered trademark of Bayer Material Science. The second aliphatic polyisocyanate can have a functionality of 2 or more (e.g., 2 or more isocyanate functional groups).

An example of a polyether modified HDI trimer-based polyisocyanate (non-ionic) is shown as Structure 4 below, which is hydrophilic and readily dispersible in water. Examples of the coating composition including a polyether modified HDI trimer-based polyisocyanate (non-ionic) as the second aliphatic polyisocyanate formed coatings having enhanced anti-static properties, but the coatings exhibited reduced integrity against certain tests such as the humidity test and 50/50-water/IPA test, which are described in more detail below. Accordingly, while these polyisocyanates may be used as the second aliphatic polyisocyanate, other polyisocyanates may provide better coating integrity.

[Structure 4]

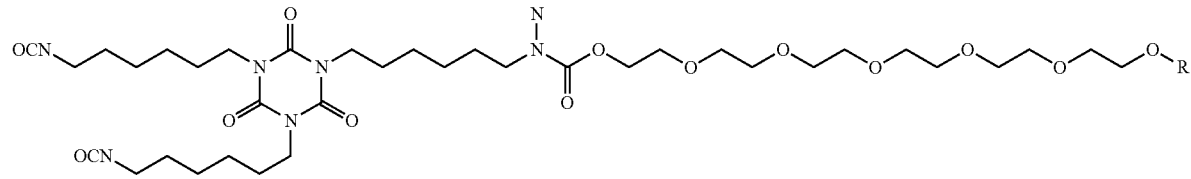

An example of a polyether modified HDI allophonate-based polyisocyanate is shown as Structure 5 below, which is more hydrophobic than the polyether modified HDI trimer-based polyisocyanates (non-ionic) described above, and has higher NCO functionality. Examples of the coating composition including a polyether modified HDI allophonate-based polyisocyanate as the second aliphatic polyisocyanate formed coatings having enhanced film durability and resistance, but the coatings exhibited reduced static charge dissipation, particularly at −40° F. Accordingly, while these polyisocyanates may be used as the second aliphatic polyisocyanate, other polyisocyanates may provide better charge dissipation.

[Structure 5]

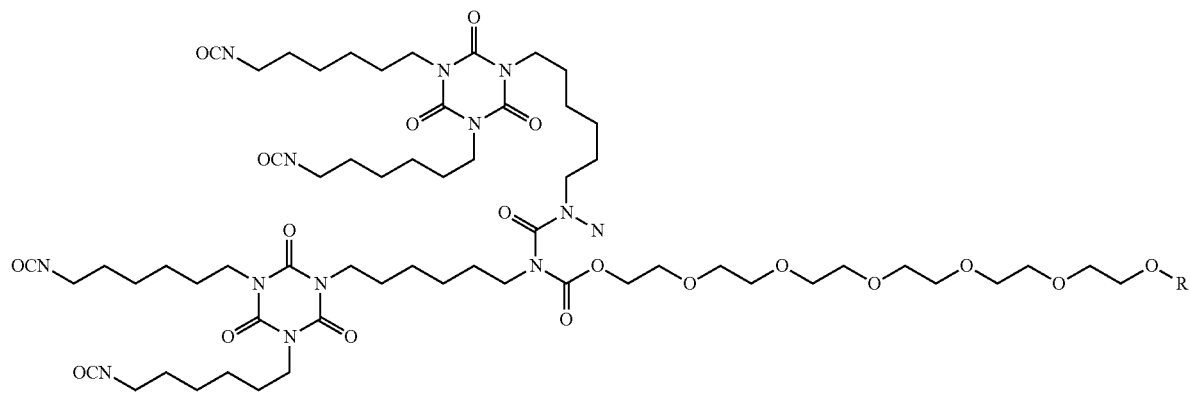

An example of an ionic aminosulfonic acid modified HDI polyisocyanate is shown as Structure 6 below, which has high NCO functionality. Ionic aminosulfonic acid modified HDI polyisocyanates (CAPS) are commercially available from Bayer Material Science as BAYHYDUR® XP2547, BAYHYDUR® XP2487/1, and BAYHYDUR® XP 2655. Examples of the coating composition including an ionic aminosulfonic acid modified HDI polyisocyanate as the second aliphatic polyisocyanate formed coatings having good chemical (e.g., solvent) resistance, but the coatings exhibited minimal improvement in anti-static properties. Accordingly, while these polyisocyanates may be used as the second aliphatic polyisocyanate, other polyisocyanates may provide better anti-static properties.

modified IPDI trimer-based polyisocyanate as the second aliphatic polyisocyanate unexpectedly formed coatings having good film integrity as well as good static charge dissipation properties. A commercial example of a polyether modified IPDI trimer-based polyisocyanate is BAYHYDUR® 401-70, which has a $T_g$ of about 30° C., forms coatings having an improved time to tack-free (i.e., a shorter time to become tack-free), reduced surface tackiness, and enhanced anti-static properties. However, when excessive amounts of polyether modified IPDI trimer-based polyisocyanate are included in the coating composition as the second aliphatic isocyanate, the coating formed from the coating composition exhibits reduced resistance to rain erosion, increased sensitivity to humidity, and reduced

[Structure 6]

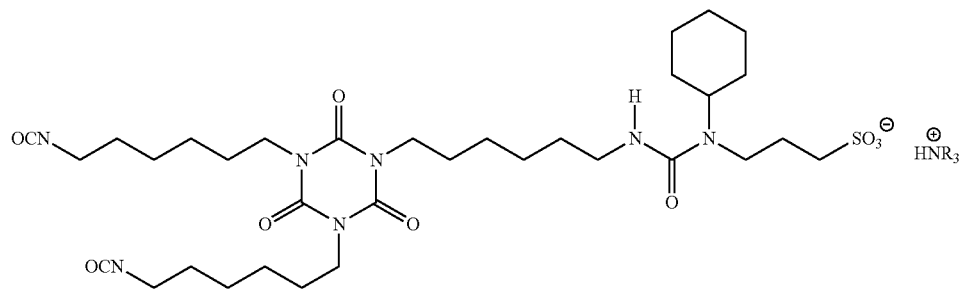

In some embodiments, the second aliphatic polyisocyanate includes a polyether modified IPDI trimer, which includes a polyether chain bonded to an isophorone diisocyanate trimer. An example of a polyether modified IPDI trimer-based polyisocyanate is shown as Structure 7 below. Examples of the coating composition including a polyether Bayer abrasion resistance. Accordingly, in some embodiments, a weight ratio of the hydrophobic first aliphatic polyisocyanate to the second aliphatic polyisocyanate is in a range of 95:5 to 85:15, such as, for example, a ratio of 95:5, 92:8, 90:10, 87:13 or 85:15.

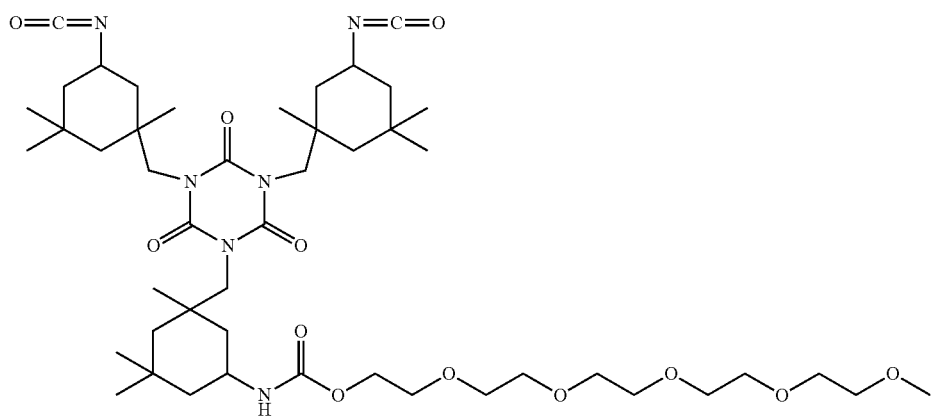

[Structure 7]

In some embodiments, the coating composition further includes a polyester polyol. For example, the polyester polyol can be an aliphatic compound having 2 to 4 hydroxyl groups or a mixture of aliphatic compounds having an average of 2 to 4 hydroxyl groups. The polyester polyol can provide crosslinking and resiliency to a coating formed from the coating composition. Non-limiting examples of the polyester polyol include polycaprolactone polyols and diols. For example, the polyester polyol can be a polycaprolactone polyol, polycaprolactone diol, or mixture thereof having a weight average molecular weight in a range of 300 to 5,000 g/mole, for example, 500 to 1,500 g/mol, and in some embodiments, about 1,000 g/mol.

Polycaprolactone polyols and diols can be prepared using ring-opening polymerization under mild conditions resulting in well-controlled polymerization resulting in no or few byproducts (e.g., water). Polycaprolactone polyols and diols prepared using ring-opening polymerization have low acid values, highly defined functionality, low polydispersity indexes and can be prepared with very high reproducibility. Polycaprolactone polyols and diols can also be prepared with low levels of impurities, are non-toxic and biodegradable, and have high flexibility at low-temperatures, good hydrolytic stability, good tear strength, consistent reactivity and low viscosity (as compared to other polyols). The high flexibility and good tear strength of polycaprolactone polyols and diols can impart resiliency to a coating formed from a coating composition including a polycaprolactone polyol and/or polycaprolactone diol. Coatings having improved resiliency exhibit enhanced Bayer abrasion (described in more detail below) and rain erosion resistance properties. Additionally, the low viscosity of polycaprolactone polyols and diols is beneficial for coating compositions having a high solids content. In some embodiments, the polyester polyol includes a polycaprolactone polyol, a polycaprolactone diol or a mixture thereof.

In some embodiments, the polyester polyol is a polycaprolactone polyol including four hydroxyl groups. For example, the polyester polyol may be a polycaprolactone polyol including four polycaprolactone chains. In some embodiments, each of the polycaprolactone chains includes one of the four hydroxyl groups at a terminal end of the polycaprolactone chain. An example of the polyester polyol (e.g., a polycaprolactone polyol) is shown as Structure 8 below. In the polyester polyol shown as Structure 8, n may be in a range of 1 to 6, such as in a range of 2 to 4. For example, in the polyester polyol shown as Structure 8, n may have an average value of 2. When the polyester polyol is a polycaprolactone polyol including four polycaprolactone chains including one hydroxyl group at a terminal end of each polycaprolactone chain, the coating composition may form a coating having enhanced crosslink density, which in turn improves the resistance of the coating to salt-fog and $SO_2$, chemicals (e.g., solvents), and inorganic acids (e.g., sulfuric acid and nitric acid). Additionally, the resultant coating may still have suitable flexibility due to the presence of the caprolactone units (e.g., 1 to 6 units of caprolactone) in each of the four chains.

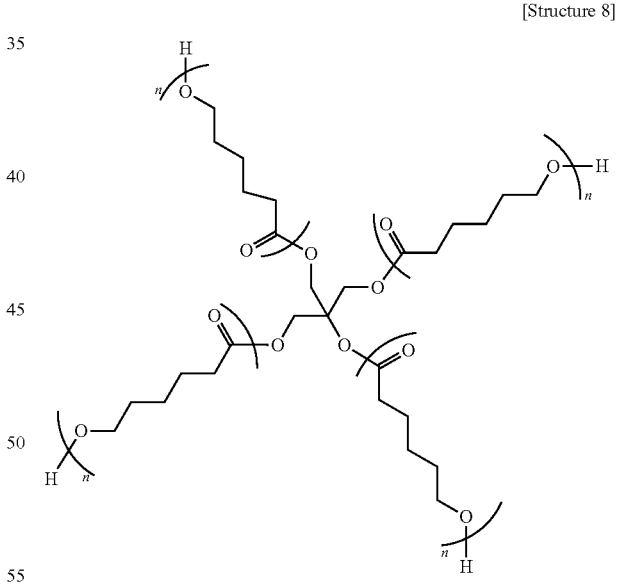

[Structure 8]

In some embodiments, the polyester polyol is a polyester diol. The polyester diol may be a linear aliphatic diol having a first end including a hydroxyl group and a second end including another primary hydroxyl group. The primary hydroxyl groups may be connected by a polycaprolactone backbone. An example of the polyester polyol (e.g., a polycaprolactone diol) is shown as Structure 9 below. In the polyester diol shown as Structure 9, n may be in a range of 1 to 8, such as in a range of 2 to 6. For example, in the polyester polyol shown as Structure 9, n may have an average value of 4.

When the coating composition includes a polyester polyol, such as a polycaprolactone diol, a coating formed from the coating composition has enhanced resiliency. For example, the relatively long polycaprolactone backbone between the hydroxyl groups may provide the coating with enhanced resiliency. Example embodiments of the coating prepared without the polyester diol, but including another polyester polyol, exhibited resistance to Bayer abrasion (described in more detail below) after 600 strokes of about 3 to 4%, while example embodiments of the coating prepared with the polyester diol exhibited resistance to Bayer abrasion of less than 1% after 600 strokes. Including the polyester diol in the coating composition in excess increases the tackiness of coatings formed from the coating composition and reduces the chemical (e.g., solvent) resistance of the coating. Accordingly, in some embodiments, the polyester polyol and the polyester diol are present in the coating composition at a weight ratio of 95:5 to 50:50, for example at a weight ratio 75:25. Non-limiting, commercially available examples of the polyester polyol and the polyester diol include Capa™ 2101, Capa™ 3031, Capa™ 3041 and Capa™ 4101, each of which are available from Perstop Group, Perstop, Sweden.

[Structure 9]

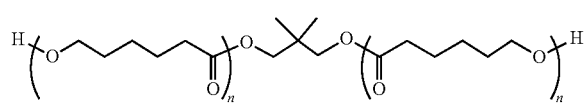

In some embodiments, the coating composition further includes a fluorinated alcohol. For example, the fluorinated alcohol can have one reactive functional group (e.g., a hydroxyl group). By having one reactive group, the fluorinated alcohol can be a migratory fluorinated compound capable of migrating to a surface of the coating composition during formation (e.g., reaction or curing) of the coating. While the extent of the migration of the first fluorinated compound (e.g., the migratory fluorinated compound) is not fully known, based on the acid resistance of the coating formed from the composition and the observed contact angle of water on the coating, it is believed that at least some of the fluorinated alcohol (e.g., the migratory fluorinated compound) migrates to the surface of the coating composition (e.g., the surface of a coating formed from the coating composition).

It is believed that the migration of the fluorinated alcohol to the surface of the coating composition (or the surface of the coating) improves the surface hydrophobicity of the resultant coating and enhances resistance of the coating to acid rain and humidity. In some embodiments, the fluorinated alcohol has a relatively low molecular weight to improve migration of the fluorinated alcohol. For example, the fluorinated alcohol may have a weight average molecular weight in a range of about 300 g/mole to about 400 g/mole, such as a weight average molecular weight of about 364 g/mole. The fluorinated alcohol can include a perfluorinated carbon chain and a hydroxyl group. The fluorinated alcohol can also include a linking group between the perfluorinated carbon chain and the hydroxyl group. Non-limiting examples of the linking group include alkylene groups, such as ethylene, propylene and vinylene groups, and sulfonamide groups.

According to embodiments of the present disclosure, a coating formed from the coating composition can include the fluorinated alcohol at a surface of the coating. By including the fluorinated alcohol at a surface of the coating, the hydrophobicity and acid resistance of the surface of the coating are increased, thereby increasing the corrosion resistance of the coating. The presence of the fluorinated alcohol at a surface of the coating composition (or the coating) also increases the corrosion resistance of a coated substrate including the coating composition, for example, as a coating. The fluorinated alcohol may be included in the coating composition in an amount in a range of about 0.1 wt % to about 5 wt %, for example, 1 wt %, based on the total weight of the solids content of the coating composition.

In some embodiments, the fluorinated alcohol is a partially fluorinated compound including a hydroxyl group. For example, in certain portions of the compound, most or all of the hydrogen atoms can be replaced with fluorine atoms, while other portions of the compound can include hydrogen bonded to carbon. In other embodiments, the fluorinated alcohol is a perfluorinated compound including a perfluorinated carbon backbone and a hydroxyl group. As would be understood by those of ordinary skill in the art, a "perfluorinated" compound (or chain) is a compound (or chain) in which all hydrogen atoms bonded to carbon atoms are replaced with fluorine atoms. The fluorinated alcohol can have a carbon backbone having 1 to 20 carbon atoms.

Non-limiting examples of the fluorinated alcohol include perfluorinated or partially fluorinated aliphatic compounds. For example, commercially available perfluorinated aliphatic compounds and/or solutions of perfluorinated aliphatic compounds such as, for example, N-ethyl-N-(2-hydroxyethyl)perfluorooctylsulphonamide (e.g., FLUORAD™ FC-10; available from 3M Company, St. Paul, Minn.); and 3,3,4,4,5,5,6,6,7,7,8,8,8-tridecafluoro-1-octanol (e.g., CAPSTONE™ 62-AL), and perfluoroalkyl-1-ethanol (e.g., ZONYL® BA) (each available from E.I. du Pont de Nemours and Company, Wilmington, Del.) can be used. ZONYL® is a registered trademark of E.I. du Pont de Nemours and Company. Examples of the fluorinated alcohol include Structures 10 and 11 below

[Structure 10]

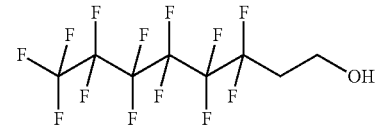

[Structure 11]

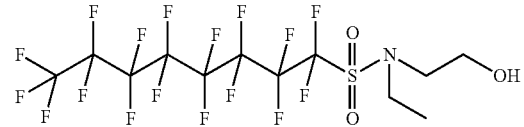

In some embodiments, the coating composition further includes a fluorinated polyol. The fluorinated polyol can be a compound having a carbon backbone with 1 to 20 carbon atoms, and two or more reactive groups, such as hydroxyl groups. That is, the fluorinated polyol can be multifunctional. For example, the fluorinated polyol can be bifunctional, such as a compound having two or more hydroxyl groups. As a result of having two or more reactive functional groups, the fluorinated polyol can react to form a three-dimensional network. In contrast to the fluorinated alcohol, the majority of the fluorinated polyol does not migrate to a surface of the coating composition (or a surface of a coating formed from the composition) and instead is distributed across the thickness of the coating composition or coating (e.g., is distributed throughout the bulk material of the coating composition, or the bulk material of a coating formed from the coating composition). The fluorinated polyol improves the bulk hydrophobicity of a coating formed from the coating composition, thereby improving the acid rain resistance of the coating. Existing coatings (e.g., topcoats), such as FX-446 (available from PPG Industries Inc.), provide some acid rain resistance, but coatings according to embodiments of the present disclosure including the fluorinated polyol (or a reacted fluorinated polyol) in the bulk of the coating provide improved acid rain resistance compared to existing coatings.

Inclusion of the fluorinated polyol causes the coating composition to form a three-dimensional polymer network. Specifically, the two or more reactive functional groups (e.g., hydroxyl groups) of the fluorinated polyol each react with other polymer molecules to form the three-dimensional network structure. The rigidity of the three-dimensional polymer network formed with the fluorinated polyol affects the resiliency of a coating formed from the coating composition. Similarly, other components of the coating composition, such as non-fluorinated polyols (e.g., the aliphatic polyester polyols), can also form part of the three-dimensional network and contribute to the resiliency of a coating formed from the composition. As an example, the rigidity of the three-dimensional network of the composition is influenced, in part, by the number of reactive functional groups (e.g., hydroxyl groups) contained in the fluorinated polyol. Thus, the number of reactive functional groups of the fluorinated polyol will affect the resiliency of a coating formed from the coating composition. Similarly, the number of reactive functional groups (e.g., hydroxyl groups) included in the non-fluorinated polyol (e.g., the polyester polyol) will also affect the resiliency of a coating formed from the coating composition.

In general, greater crosslink density (which is directly related to the number of reactive functional groups (e.g., hydroxyl groups) included in each of the components of the composition) leads to greater rigidity, improved chemical and solvent resistance, and decreased abrasion resistance. The resiliency of a coating formed from the coating composition is also influenced by the molecular weight, and size and type of the backbone of the fluorinated and non-fluorinated compounds in the coating composition. When the composition includes compounds that have more rigid backbone structures, the composition will also be more rigid, while compounds that have relatively more flexible backbone structures will produce a composition that has relatively more resiliency. For a given polyol, increasing the molecular weight of the polyol generally results in a compound that forms coatings having greater resiliency, as compared to the corresponding lower molecular weight polyols.

Accordingly, the desired resiliency of the composition can be achieved by appropriately selecting the number of reactive functional groups (e.g., hydroxyl groups) and molecular weights of the fluorinated compounds or the non-fluorinated compounds. For example, a fluorinated polyol having a fluorinated carbon backbone and two reactive functional groups (e.g., two hydroxyl groups) will form a three-dimensional network that is more flexible than the three-dimensional network formed by a fluorinated polyol having similar chemical composition, the same (or substantially the same) molecular weight, and a fluorinated carbon backbone and three reactive groups (e.g., three hydroxyl groups). Similarly, a fluorinated polyol having three reactive functional groups (e.g., three hydroxyl groups) will form a three-dimensional network that is more flexible than the three-dimensional network formed by a fluorinated polyol having the same (or substantially the same) chemical structure, the same (or substantially the same) molecular weight, a fluorinated carbon backbone, but four reactive groups (e.g., four hydroxyl groups). Increasing the flexibility of the three-dimensional network resulting from use of a fluorinated polyol having two hydroxyl groups increases the resiliency of a coating formed from the coating composition. Thus, in some embodiments, the coating composition (or coating) includes a bifunctional fluorinated polyol (e.g., a compound having two hydroxyl groups), such coating compositions produce coatings having increased resiliency over coatings produced from coating compositions including trifunctional or tetrafunctional fluorinated polyols (e.g., compounds having three or four hydroxyl groups, respectively). The above-described principles are also applicable to other components of the coating composition, such as the non-fluorinated compounds. For example, desirable resiliency of the coating) can be achieved using an appropriate mixture of non-fluorinated di-functional and tetra-functional polyester polyols in the coating composition.

Non-limiting examples of the fluorinated polyol include fluoropolymers and fluoropolymer precursors, examples of which include, but are not limited to, commercially available pure resins and/or solutions of fluoropolymers and/or fluoropolymer precursors such as LUMIFLON® LF 600X, LUMIFLON® LF 9716, LUMIFLON® LF 9721, LUMIFLON®-910LM and LUMIFLON® LF 916F (available from AGC Chemicals Inc., Exton, Pa.); FLUOROLINK® D10-H, FLUOROLINK® E10-H, FLUOROLINK® D, FOMBLIN® ETX, FOMBLIN® MF-402 and FLUOROBASE Z-1030 (each available Solvay Solexis, Inc.); and POLYFOX® PF-656 and POLYFOX® PF-7002 (available from Omnova Solutions, Fairlawn, Ohio). LUMIFLON® is a registered trademark of Asahi Glass Co., Ltd., FLUOROLINK® is a registered trademark of Solvay Solexis, Inc., FOMBLIN® is a registered trademark of Solvay Fluorati Holding S.P.A., Corporation and POLYFOX® is a registered trademark of Ampac Fine Chemicals LLC.

Of the foregoing examples of the fluorinated polyol, LUMIFLON®-910LM, which is a fluoroethylene vinyl ether, exhibited the best compatibility with the other components of the coating composition. LUMIFLON®-910LM was compatible with the other components of the coating composition throughout a wide range of amounts. The alternating fluoroethylene and vinyl ether segments of LUMIFLON®-910LM provide the resultant coating with good weatherability. For example, the fluoroethylene segments may enhance durability and hydrophobicity of the resultant coating. Accordingly, in some embodiments, the fluorinated polyol includes a backbone including alternating substituted or unsubstituted fluoroethylene and substituted or unsubstituted vinyl ether segments. An example of the fluorinated polyol is shown as Structure 12 below, in which "FE" indicates a repeating fluoroethylene unit and "VE" indicates a repeating vinyl ether unit. In Structure 12, $R_1$ may provide transparency, gloss and hardness; $R_2$ may provide flexibility; $R_3$ may provide crosslinking ability; and $R_4$ may provide adhesion.

[Structure 12]

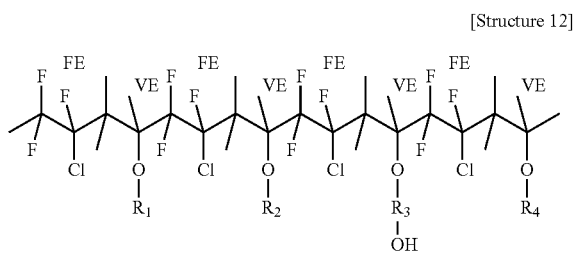

The fluorinated polyol can be included in the coating composition in an amount in a range of about 5 wt % to about 35 wt %, such as in a range of about 15 wt % to about 25 wt %, based on the total weight of the solids in the coating composition. In some embodiments, the fluorinated polyol is present in an amount of about 20 wt % based on the total weight of the solids in the coating composition. At 5 wt % and 10 wt % of the fluorinated polyol, there was some improvement in the acid resistance of the resultant coating. At 15 wt % and 20 wt % of the fluorinated polyol, the resultant coating exhibited substantially enhanced resistance to sulfuric acid and nitric acid (e.g., a 50:50 mixture of sulfuric acid and nitric acid) as compared to existing coatings, such as FX-446. The resultant coating also exhibited improved surface tackiness and steam, humidity and QUV resistance as compared to existing coatings, such as FX-446. Unexpectedly, the fluorinated polyol did not noticeably reduce the anti-static properties of the coating. However, the fluorinated polyol does reduce the Bayer abrasion resistance of the resultant coating. For example, one example of the coating composition including 20 wt % of the fluorinated polyol (based on the total weight of the solids in the coating composition) formed a coating that exhibited a change in haze of 3.5-4.0% after 600 strokes of the Bayer abrasion test (described in more detail below), while an example of the coating composition that did not include the fluorinated polyol exhibited a change in haze of about 1% after 600 strokes of the Bayer abrasion test.

The coating composition described herein can be formed by mixing (or blending) a Part A mixture (e.g., a base component) with a Part B mixture (e.g., a curing component). For example, the Part A mixture and the Part B mixture can be mixed together and cured to form a durable composition (or coating) which is highly weatherable, abrasion resistant, acid resistant and resistant to chemicals or solvents. After mixing the Part A mixture and the Part B mixture, the resultant coating composition can be air dried for a time period in a range of 1.5 to 2 hours and then cured at about 200° F. for a time period of about 5 hours to form a coating. For example, the coating composition (or coating) can form a polyurethane coating having anti-static properties.

The Part A mixture and Part B mixture may be mixed to achieve a ratio of reactive isocyanate groups to reactive hydroxyl groups (e.g., an NCO to OH ratio) in a range of 1.05 to 1.5, such as a ratio of about 1.3. An NCO to OH ratio of about 1.05 resulted in a coating exhibiting good abrasion resistance, but compromised QUV resistance (described in more detail below). An NCO to OH ratio of about 1.3 resulted in a coating exhibiting good abrasion resistance, good QUV resistance, and good resistance to rain erosion. An NCO to OH ratio of about 1.4 resulted in a coating exhibiting good QUV resistance, but lower abrasion resistance and inferior resistance to rain erosion, as compared to the coating formed from the coating composition having an NCO to OH ratio of about 1.3. An NCO to OH ratio of about 1.5 resulted in a coating composition having a short pot life, poor surface flow and poor cosmetics.

The Part A mixture can include, for example, any or all of the polyester polyol (e.g., the first and/or second polyester polyol), the fluorinated polyol, the hydrophilic polyol and the fluorinated alcohol. The Part A mixture can further include additives, such as, for example, a migratory ultraviolet light (UV) absorber, a reactive UV absorber including a hydroxyl group, a migratory UV stabilizer, a reactive UV stabilizer including a hydroxyl group, an antistatic agent (e.g., a conductive compound), an antioxidant, a catalyst, a flow control agent and/or a solvent. However, the Part A mixture need not contain each of these components. The Part A mixture can include additional additives as well.

A migratory UV absorber and/or a reactive UV absorber may be included in the coating composition to absorb UVA and UVB radiation incident to the resultant coating. UV absorbers increase the resistance of the resultant coating to yellowing and/or degradation, and improve long term outdoor durability of the coating. The migratory UV absorber and reactive UV absorber can be based upon any suitable UV absorber. The migratory UV absorber does not include a reactive functional group (e.g., a hydroxyl group) and migrates to a surface of the coating composition (or coating) during the formation (e.g., curing) of the coating composition (or coating). By including the migratory UV absorber, the coating includes a higher concentration of UV absorber at the surface of the composition than a coating not including a migratory UV absorber. Having a higher concentration of UV absorber at the surface of the composition (or coating) improves the lifetime of the coating made from the composition. However, it is desirable to also have UV absorber in the bulk of the composition, as having UV absorbers both at the surface of the composition and in the bulk of the composition will extend the lifetime of a coating made from the composition as compared to a coating made from a composition that only includes UV absorber at the surface.

Additionally, if the compounds migrate to a surface of the composition too quickly, the composition may form haze. For example, UV absorbers that do not include a hydroxyl group (e.g., a reactive hydroxyl group) may migrate to the surface of the coating too quickly resulting in haze. Accordingly, in some embodiments, the coating composition includes the migratory UV absorber only in small amounts (e.g., in a range of about 0.5 wt % to about 0.75 wt % based on the total weight of the solids of the coating composition), if at all. Examples of migratory UV absorbers are shown as Structures 13-17 below.

[Structure 13]

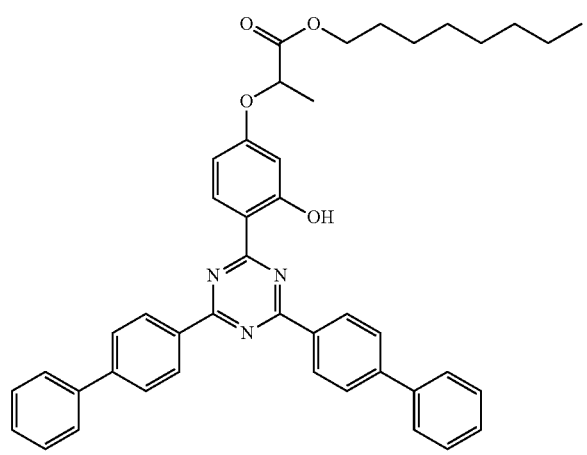

[Structure 14]

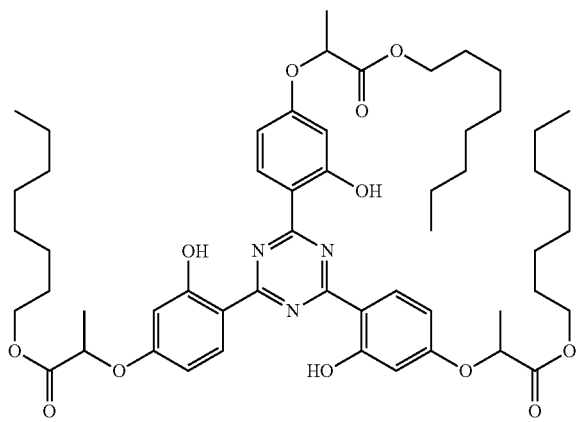

[Structure 15]

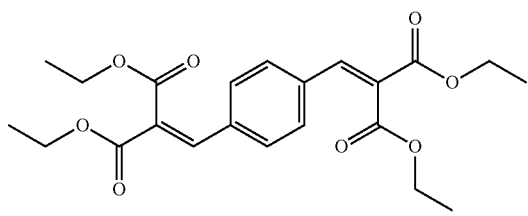

[Structure 16]

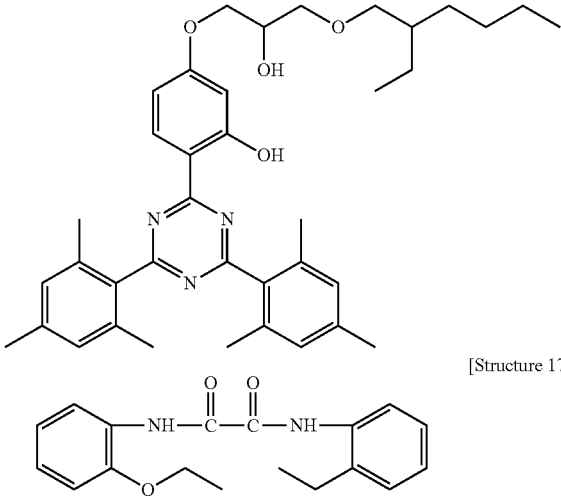

[Structure 17]

A coating composition according to embodiments of the present disclosure can include reactive UV absorber as well as, or instead of, the migratory UV absorber. The reactive UV absorber can include one or more reactive functional groups, such as a hydroxyl group. By including the reactive groups, a majority of the reactive UV absorber does not migrate to the surface of the coating composition or the resultant coating and instead is distributed across the thickness of the coating composition or resultant coating (e.g., is distributed throughout the bulk of the coating composition or the resultant coating). Additionally, if the reactive UV absorber is multifunctional, it may contribute to the three-dimensional polymer network formed on reaction of the components of the composition. A non-limiting example of the reactive UV absorber is shown as Structure 18 below, and an example of a commercially available mixture of a migratory UV absorber and a reactive UV absorber is shown as Structure 19 below.

[Structure 18]

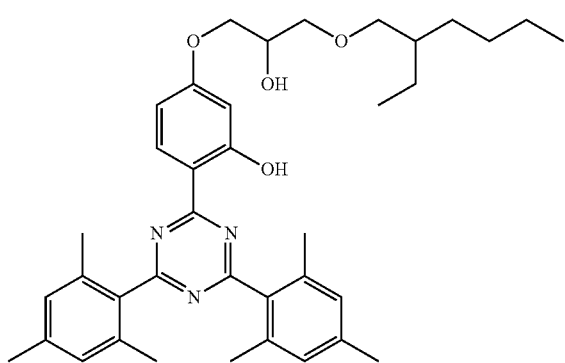

-continued

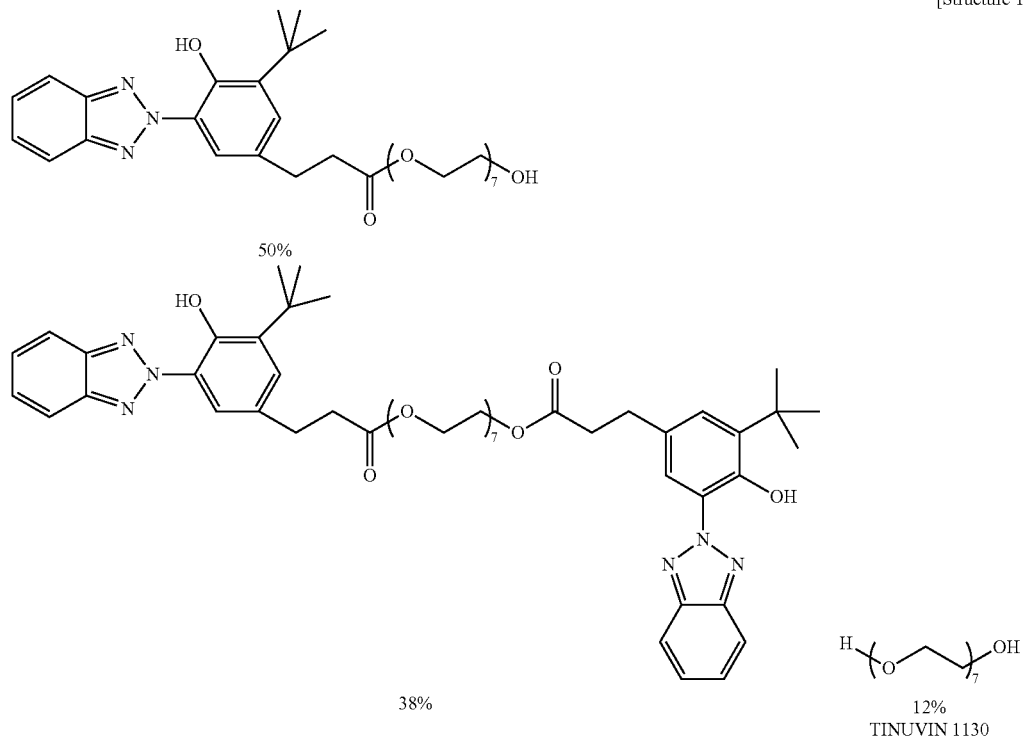

[Structure 19]

Non-limiting commercially available examples of the migratory UV absorber and reactive UV absorber include propanoic acid, 2-[4-[4,6-bis([1,1'-biphenyl]-4-yl)-1,3,5-triazin-2-yl]-3-hydroxyphenoxy]-,isooctyl ester (e.g., TINUVIN® 479), β-[3-(2-H-benzotriazole-2-yl)-4-hydroxy-5-t-butylphenyl]-propionic acid-poly(ethylene glycol) 300 ester, bis{β-[3-(2-H-benzotriazole-2-yl)-4-hydroxy-5-t-butylphenyl]-propionic acid}-poly(ethylene glycol) 300 ester (e.g., TINUVIN® 1130), TINUVIN® 477 and 2-[4-[(2-hydroxy-3-(2'-ethyl)hexyl)oxy]-2-hydroxyphenyl]-4,6-bis(2,4-dimethylphenyl)-1,3,5-triazine (e.g., TINUVIN® 405) (each available from BASF Resins); and p-phenylenebis(methylenemalonic acid)tetraethyl ester (e.g., HOSTAVIN® B-CAP), 2-ethyl,2'-ehtoxy-oxalanilide (e.g., HOSTAVIN® VSU), and propanedioic acid, 2-[(4-methoxyphenyl)methylene]-,1,3-dimethylester (e.g., HOSTAVIN® PR-25) (each available from Clariant International Ltd.). TINUVIN® is a registered trademark of Ciba Specialty Chemical Corporation. HOSTAVIN® is a registered trademark of Hoechst GMBH Corporation.

Example coatings formed from coating compositions including the UV absorber according to Structure 18 exhibited no discernible sign of haze formation. It is believed that the presence of the hydroxyl group of the foregoing reactive UV absorbers prevented (or reduced) the migration of the UV absorbers to the surface of the coating by reacting with isocyanate functional groups to form urethane linkages and becoming part of the three-dimensional network, thereby preventing (or reducing) the formation of haze. TINUVIN® 1130 includes both a reactive UV absorber and a migratory UV absorber and, therefore, may cause haze in the coating when used in excess. The migratory UV absorber may be included in the coating composition in a small amount without causing haze in the resultant coating. For example, the migratory UV absorber shown as Structure 13 can be included in the coating composition in an amount in a range of about 0.5 wt % to about 0.75 wt % based on the total weight of the solids of the coating composition without causing noticeable haze in the resultant coating, while also enhancing the QUV resistance of the resultant coating. It is believed, that the migratory UV absorber shown as Structure 13 will be present at a higher concentration at the surface of the resultant coating than in the bulk material of the coating, thereby providing additional protection against UV light. Some UV absorbers, such as HOSTAVIN® B-CAP, exhibited poor solubility as a result of poor compatibility with the other components of the coating composition.

The migratory UV stabilizer and reactive UV stabilizer can be based upon any suitable UV stabilizer, such as any suitable free radical scavenger, that has been modified to be reactive or migratory. The migratory UV stabilizer and reactive UV stabilizer reduce degradation of the coating by UV light by scavenging free radicals formed by the dissociation of chemical bonds as a result of UV light absorption. The migratory UV stabilizer does not include a reactive functional group (e.g., a hydroxyl group) and migrates to the surface of the coating during the formation (e.g., curing) of the coating. By including the migratory UV stabilizer, the coating includes a higher concentration of the UV stabilizer at the surface of the coating than does a coating not including a migratory UV stabilizer. Having a higher concentration of UV stabilizer at the surface of the coating improves the lifetime of the coating, and hence improves the lifetime of a coating formed from the coating composition.

However, it is desirable to also have UV stabilizers in the bulk of the coating, as having UV stabilizers both at the surface of the coating and in the bulk of the coating will extend the lifetime of the coating as compared to a coating that only includes UV stabilizers at the surface. Additionally, if the compounds migrate to a surface of the coating too quickly, the coating may develop a haze. Accordingly, a composition according to embodiments of the present disclosure can include the reactive UV stabilizer, the migratory UV stabilizer or both. The reactive UV stabilizer can include one or more reactive functional groups, such as a hydroxyl group. By including the reactive groups, a majority of the reactive UV stabilizer does not migrate to a surface of the coating and instead remains in the interior of the coating (e.g., in the bulk material of the coating) due to reaction of the reactive functional groups with other components of the coating composition. Additionally, if the reactive UV stabilizer is multifunctional, it may contribute to the formation of the three-dimensional network. Non-limiting commercially available examples of the UV stabilizer include propanedioic acid [(4-methoxyphenyl)-methylene]-bis(1,2,2,6,6-pentamethyl-4-piperidinyl)ester (e.g., HOSTAVIN® PR-31 available from Clariant International Ltd.), Sanduvor 3055 (available from Clariant International Ltd.) and commercially available hindered aminoether light stabilizers such as TINUVIN® 123, TINUVIN® 292, TINUVIN® 326, TINUVIN® 328, TINUVIN® 765, TINUVIN® 900, TINUVIN® 900 and TINUVIN® 152 (each available from BASF Resins). TINUVIN® is a registered trademark of Ciba Specialty Chemical Corporation. HOSTAVIN® is a registered trademark Hoechst GMBH Corporation. Examples of reactive UV stabilizers and migratory UV stabilizers are shown as Structures 20-29. Example coatings formed from examples of coating compositions including the UV stabilizer according to Structure 21 exhibited no discernible sign of haze formation.

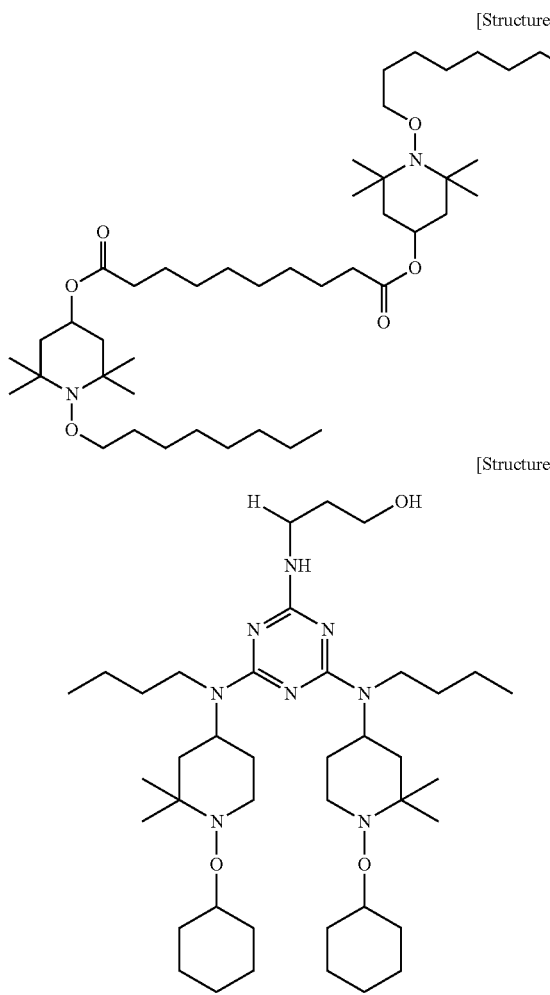

[Structure 20]

[Structure 21]

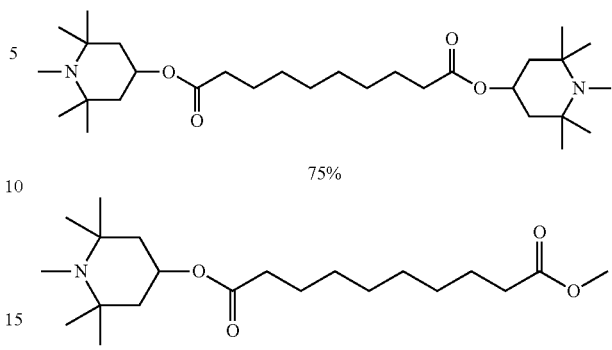

[Structure 22]

75%

25%

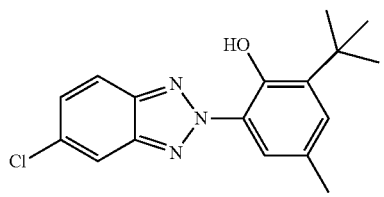

[Structure 23]

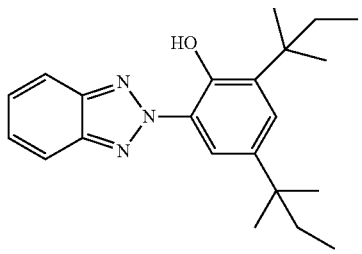

[Structure 24]

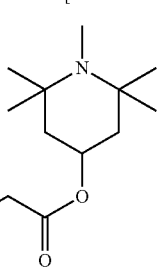

[Structure 25]

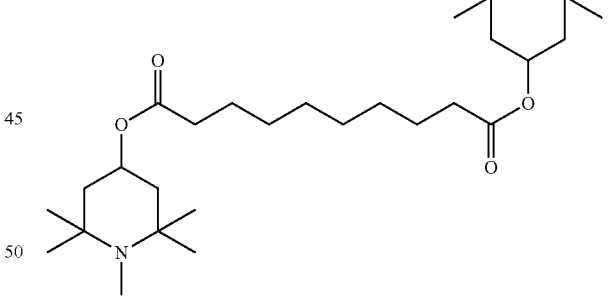

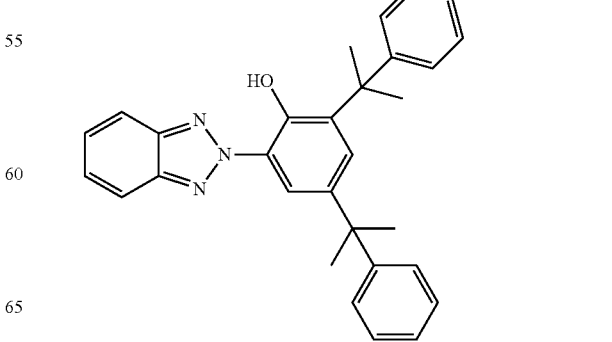

[Structure 26]

-continued

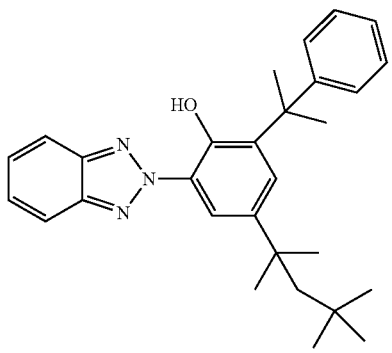

[Structure 27]

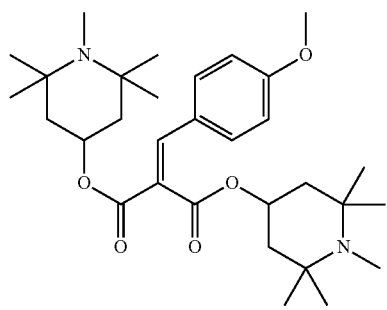

[Structure 28]

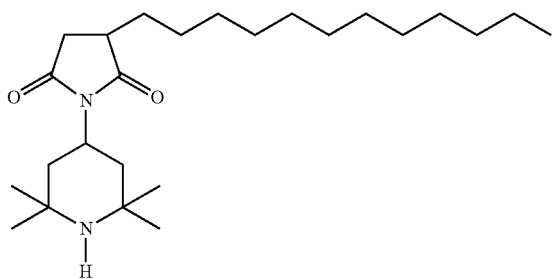

[Structure 29]

The Part A mixture can include anti-static agents (e.g., conductive compounds, such as conductive metal oxides, quaternary ammonium salts, inherently conductive polymers, and/or other suitable conductive agents), such as those described in U.S. Patent Application Publication No. 2010/0025533 and U.S. Patent Application Publication No. 2010/0028684, the entire contents of which are incorporated herein by reference. Non-limiting commercially available examples of the anti-static agents include Antistat SD100 (available from E.I. du Pont de Nemours and Company), EA Antistat (available from Wells Plastics Ltd), and MAXOMER® AS-1018/75DC (available from PCC Chemax, Inc.). MAXOMER® is a registered trademark of PCC Chemax, Inc.

The anti-static agents (e.g., conductive compounds) can be used to reduce the electrical resistance (e.g., sheet resistance) of the resultant coating to levels acceptable for P-static dissipation, which should be maintained even at low temperatures (e.g., −40° F.). The hydrophilic polyisocyanates discussed above can act as a conductive compound. Alternatively or additionally, a hydrophilic polyol may be included in the coating composition.

For example, the coating described herein can have a sheet resistance such that electric charge (e.g., P-static) can pass through the coating to another layer (e.g., an electrically conductive stack), which can then dissipate or drain the charge. If the resistance of the coating is too high, the amount of electric charge that can pass through the coating is reduced, and the conductive layer will not provide acceptable levels of P-static dissipation. In some embodiments, a primer layer (e.g., a polyacrylate primer) may be included between the coating and the conductive layer (e.g., the electrically conductive stack). Although the primer layer may have a high sheet resistance (e.g., higher than that of the coating), charge may still pass through the coating and the primer layer to the conductive layer if the primer layer is sufficiently thin. Thus, if a primer layer is included it should be made sufficiently thin to allow enough electric charge to pass through the coating and the primer layer to the conductive layer to provide P-static dissipation.

The general electrical resistance of the polyurethane topcoats are more than or equal to $10^{12} \Omega/\square$ to independently dissipate the static charge. The sheet resistance of the coatings described herein varies depending upon the sheet resistance of the material on which the coating is formed. For example, if the coating is on a dielectric layer (e.g., polycarbonate), the sheet resistance of the coating may be about $10^9$ ohms per square, even if a thin primer layer is included between the coating and the dielectric layer. If the coating is on a conductive layer (e.g., a titanium oxide/Au/titanium oxide stack), the sheet resistance of the coating may be $10^7$ ohms per square.

Hydrophilic polyisocyanates, such as those described above, improve conductivity in the coatings. Additionally, as described above, hydrophobic polyisocyanates provide coatings with durability. Thus, as described above, through the combination of hydrophobic and hydrophilic polyisocyanates (e.g., hydrophobic/hydrophilic HDI and IPDI based polyisocyanates), a coating having a good balance of hardness, resiliency, surface tackiness, and conductivity can be obtained.

According to some embodiments, the coating composition may further include a hydrophilic polyol (e.g., a reactive anti-static resin), such as hydrophilic polyol having a functionality of more than 2. The p-static properties of a coating can be significantly improved by introduction of the hydrophilic polyol. The hydrophilic polyol can be any suitable hydrophilic polymer having salt moieties and pendant reactive hydroxyl groups. One non-limiting example of a suitable hydrophilic polyol is Superstat 463, which is commercially available from Advanced Materials & Coating Specialties, Azusa, Calif. The hydrophilic polyol reacts with the polyisocyanates and becomes part of the three dimensional network. A clear coating is then formed with no discernible sign of migration of the hydrophilic polyol to the surface of the coating. It is believed that the conductivity is achieved by moisture absorption in the coating, but the hydrophilic polyol appears to have some inherent conductivity.

A coating having an electrical resistance of $10^5 \Omega/\square$ (on polycarbonate) and good optics is formed when the combined amount of the polyester polyol and the hydrophilic polyol includes 50 wt % of Superstat 463. Such a coating has good performance in p-static tests, even at −40° F. The hydrophilic polyol (e.g., Superstat 463) may be included in the coating composition in an amount in a range of about 5 wt % to about 30 wt % based on the total weight of the solids of the coating composition. When the hydrophilic polyol (e.g., Superstat 463) is included in the coating composition in an amount that is outside of the foregoing range (e.g., is higher than 30 wt %), the resultant coating may have high surface tackiness and may be susceptible to moisture attack when exposed to humidity. The surface tackiness can be reduced by the addition of BYK 3700 (a polydimethylsiloxane resin with pendant hydroxyl groups), incorporation of ethylene glycol or trimethylol propane (TMP), and/or partial replacement of N-75 with IPDI trimer. None of these improvements in surface tackiness yielded a coating having good weatherability, but some of the coatings did exhibit good abrasion resistance.

Useful anti-static coatings were formulated by reducing the hydrophilic polyol (e.g., Superstat 463) content down to a range of 14 wt % to 26 wt %. A typical two-part polyurethane coating has a resistance of more than $10^{12}$ ohms/sq. and is dielectric. By addition of 14 to 24 wt % Superstat 463 (depending upon the other components of the coating composition), the resistance is reduced to between the range of $10^8$ to $10^9$ ohms/sq. on polycarbonate and $10^7$ to $10^8$ ohms/sq. on a conductive layer, such as a stack including titanium oxide/Au/titanium oxide, a stack including AZO/Au/AZO, an ITO layer, an Au layer, an Al layer, and the like. It has repeatedly been demonstrated, by the results of specification tests, that a combination of conductive layer/primer/topcoat can readily dissipate p-static charge even at temperatures as low as −40° F.

Superstat 463 can enhance the conductivity of the coating. Superstat 463 is compatible with all components of the coating composition and gives a coating with high transparency, low haze, good surface flow, and superior cosmetics. Interestingly, without the presence of Superstat 463, the coating composition may exhibit poor film-forming properties. Therefore, Superstat may be beneficial in enhancing the compatibility among the hydrophilic/hydrophobic components of the coating composition.

The Part A mixture can further include a catalyst, a flow control agent and solvents as is known in the art. Selection of a suitable catalyst, flow control agent and solvent is within the skill of those of ordinary skill in the art and, therefore, further discussion of those components will be omitted.

The Part B mixture (e.g., curing component) can include the isocyanate as described above. The curing component can further include cure accelerators, cure retardants, plasticizers, additives, and/or fillers. However, like the Part A mixture, the Part B mixture need not contain each of these components. The Part B can include additional additives as well. Selection of suitable cure accelerators, cure retardants, plasticizers, additives, and fillers is within the skill of those of ordinary skill in the art and, therefore, further discussion of those components will be omitted.

According to embodiments of the present disclosure, the coating composition includes at least one solvent. The solvent(s) may be added to the Part A mixture, the Part B mixture, or both the Part A mixture and the Part B mixture. The solvent(s) reduce the viscosity of the coating composition to make it flow-coatable. The integrity and appearance of the resultant coating can be affected by the nature of the solvents used, even though the solvents are not a permanent component of the cured coating. The evaporation rate of the solvent (or solvent mixture) can be adjusted so that evaporation takes place quickly during the initial drying (e.g., after flow coating) to prevent excessive flow, but slowly enough to give sufficient leveling and adhesion. The solvent(s) used can be non-reactive with isocyanates and non-aggressive against the substrate and/or coated surfaces, so that no (or little) attack takes place during the flow coating and/or airdrying process. The solvent(s) could also influence the rate of isocyanate-hydroxyl reactions, for example during the airdrying period, depending on the extent of hydrogen bonding and dipole moment character of the solvent.

Non-limiting examples of the solvent include isobutyl acetate, 2,6-dimethyl-4-heptanol, butoxy ethyl acetate, isobutyl acetate, 2-butoxyethyl acetate, diisobutyl ketone, dipropyleneglycol dimethyl ether, and propyleneglycol dimethyl ether. In some embodiments, the solvent includes diacetone alcohol (DAA). DAA has a slow evaporation rate and good flow properties. DAA effectively dissolves all (or most) of the components of the coating composition to give a clear, homogeneous solution. DAA has a tertiary hydroxyl group, but the reactivity of the tertiary hydroxyl with isocyanate is much lower than the hydroxyls of the other components of the coating composition, and since DAA begins to evaporate during the airdrying period, the reaction of DAA with the polyisocyanates is negligible.

The solvent may also be used to adjust the solids content of the coating composition. It may be beneficial to maximize the thickness of the resultant coating for improved performance in the rain erosion test. At 70% solids content the coating composition is too viscous for successful flow coating application with existing equipment. At a solids content of 65%, the coating composition should form a coating that is free from cosmetic defects, has good surface quality, and provides good performance in the rain erosion test. A coating composition having a 65% solids content can be prepared using a two component mixer (e.g., a mixer, such as the DL 2 mixer, available from Liquid Control Ltd., Wellingborough, England) and form a coating having good surface quality.

The coating described herein may be the outer most layer of a coated substrate, and the coating may be a tough, durable and weather resistant material, such as polyurethane, yet is sufficiently pliable and flexible to prevent crack formation due to thermal stress. As described above, the coating composition, and therefore the coating, can include conductive compounds to provide anti-static properties, and the coating can be conductive to help dissipate static charge and other electromagnetic forces. For example, the coating can have antistatic properties to allow static charge to be dissipated to underlying conductive layer(s) (e.g., the carbon nanotube layer), if present. In some embodiments, the coating includes other additives such as those described in U.S. Patent Application Publication No. 2010/0025533 and U.S. Patent Application Publication No. 2010/0028684 (e.g., conductive metal oxides, quaternary ammonium salts, inherently conductive polymers, and/or other suitable conductive agents). The coated substrates disclosed herein may further include any suitable additional conductive layer or layers.

In some embodiments, the coated substrate (e.g., coated transparency) provides the functionality required of a modern stealth aircraft canopy. For example, in some embodiments, the coating has a sheet resistance suitable for draining p-static charge and/or radar attenuation. More specifically, the carbon nanotube layer can be electrically conductive and have a sheet resistance suitable for draining p-static charge and the coating can include a metal layer having a sheet resistance suitable for radar attenuation. When positioned over a transparency or substrate, such as an aircraft canopy, a carbon nanotube layer having a sheet resistance suitable for draining p-static charge can prevent or reduce the buildup of static charge on the coated transparency by draining or dissipating the static charge. Another conductive layer, such as a metal layer including gold, silver or a combination thereof, can provide radar attenuation instead of or in addition to the carbon nanotube layer, and the carbon nanotube layer can drain p-static charge.

Additionally, some embodiments of the coated substrate are transparent and, for example, have a visible light transmittance of at least about 80% (or >80%). In some embodiments, for example, when the coating (or coated substrate) does not include a metal layer, the coated substrate can have a visible light transmittance of >80% to about 82%. In some embodiments, the coating (or coated substrate) includes a metal layer and has a visible light transmittance of at least about 60% (or >60%), for example, greater than or equal to 61%. In some embodiments, the visible light transmittance of the coated substrate is above 65% (e.g., in a range of about 65% to about 67%).

Some embodiments of the coated transparency of the present disclosure can include one or more additional layer (s). For example, in some embodiments, the coated transparency further includes a topcoat (e.g., a conductive top layer including a conductive metal oxide, a quaternary ammonium salt, an inherently conductive polymer, and/or other suitable conductive agent), a base layer(s) (e.g., a layer including a material selected from polyepoxides, polyacrylates, polyurethanes, polysiloxanes, and combinations thereof), and/or a tie layer(s) (e.g., an acrylic polymer and/or mixture of polymers), such as those described in U.S. Patent Application Publication No. 2010/0025533 and U.S. Patent Application Publication No. 2010/0028684, the entire contents of which are herein incorporated by reference. The coating may be coated with a high resistance topcoat (e.g., a polyurethane antistatic coating), so long as the static charge can be transferred through the organic topcoat into the low resistance layer (or layers), for example, the carbon nanotube layer.

The following example is presented for illustrative purposes only and is not to be viewed as limiting the scope of the present disclosure. Unless otherwise indicated, all parts and percentages in the following examples, as well as throughout the specification, are by weight.

Example 1

A polyacrylate tie coat was formed on a polycarbonate substrate by flow coating. The tie coat was air dried at room temperature for a time of about 1 to 2 hours and then heat cured at 200° F. for 2 hours to form a tie-coated substrate. Carbon nanotubes (CG300, available from SouthWest Nano Technologies (SWENT), Norman, Okla.) having a diameter of about 0.84 nm and a length of about 790 nm were spray coated onto the tie-coated substrate. The carbon nanotubes were air dried for about 1 to 2 hours at room temperature. A polyurethane coating composition was flow coated onto the carbon nanotubes, air dried for 90 minutes at room temperature, and then cured at 200° F. for 5 hours to form a coating on the substrate.

Haze and Luminous Transmittance Tests

A 12 inch by 12 inch coupon prepared according to Example 1 was tested according to ASTM D1003 using a Haze-Gard Plus instrument. Haze measures the clearness and transparency of the film (in some embodiments the films are not translucent and do not diffuse light), while luminous or visible light transmittance indicates the amount of visible light transmitted through the sample. The coupon according to Example 1 exhibited a visible light transmittance of 81.4% and a haze of 0.77%. According to the test results, the coupon according to Example 1 meets the visible light transmittance and haze values for aircraft canopy, windshield and windows, which are 58% or above and 10% or below, respectively. Thus, it is expected that a canopy, windshield or window prepared as in Example 1 will also exhibit the same or substantially the same visible light transmittance and haze values.

Cross-Hatch Adhesion

A 12 inch by 12 inch coupon prepared according to Example 1 was tested for cross-hatch adhesion according to ASTM D3359. The coating exhibited 100% adhesion to the substrate.

Humidity Test

A 3 inch by 6 inch coupon prepared according to Example 1, was exposed to 100% condensing humidity at 122° F. (50° C.). The haze and visible light transmittance (VLT) were then measured after 12 weeks of exposure and no adverse effects were observed. The visible light transmittance was observed to be about 81% and the haze was observed to be about 1% and, thus, no significant change in light transmittance or haze was observed after this test. The coupon was also tested for cross-hatch adhesion according to ASTM D3359, and exhibited 100% adhesion to the substrate.

Humidity and Solar Radiation (QUV) Test

A 3 inch by 6 inch coupon prepared according to Example 1, was exposed to cycles of 8 hours of ultraviolet (UV) radiation at 158° F. (70° C.) followed by exposure to condensation for 4 hours at 122° F. (50° C.). The haze and visible light transmittance (VLT) were then measured after the cycles had been repeated for a total of 12 weeks and no adverse effects were observed. The visible light transmittance was observed to be about 81% and the haze was observed to be about 1% and, thus, no significant change in light transmittance or haze was observed after this test. The coupon was also tested for cross-hatch adhesion according to ASTM D3359, and exhibited 100% adhesion to the substrate.

Bayer Abrasion Test

The abrasion resistance of a 4 inch by 4 inch coupon prepared according to Example 1 was tested according to ASTM F735 for 300 cycles. Prior to the Bayer abrasion test, the coupon exhibited a visible light transmittance of >80% and a haze of 1%, as determined by the above-described haze and luminous transmittance test. After 300 cycles of the Bayer Abrasion test, the coupon exhibited a visible light transmittance of 78% and a change in haze of <4%, as determined by the above-described haze test. According to the test results, the visible light transmittance and haze of the coupon were not significantly altered by the Bayer abrasion test.

Rain Erosion Test

A 1 inch by 1 inch coupon prepared according to Example 1 was exposed to simulated rainfall at a wind speed of 550 miles per hour (mph) at the University of Dayton Research Institute (UDRI). The coupon was inspected for degradation of the coating after 44 minutes of exposure to the simulated rainfall and less than 2% degradation of the coating was observed.

Accelerated Steam Test

A 3 inch by 6 inch coupon prepared according to Example 1 was placed just above boiling water in an enclosed chamber to expose the coating steam. After 16 hours of exposure, no adverse effects were observed and the coating exhibited 100% adhesion.

P-Static Test

A 12 inch by 12 inch coupon prepared according to Example 1. A top electrode (a silver paste) having a 1 inch diameter was applied to the topcoat of the coupon and cured at 120° F. for 3 hours. The carbon nanotube coating of the coupon was grounded, and coupon was placed in a cold box chamber. The substrate temperature was cooled to −40° F. using flowing liquid nitrogen. A voltage of about 1.6 kV was applied through the top electrode using an AC/DC voltage tester (available from Associate Research, Inc.) to achieve a current density of 50 µA/ft². The current was monitored using a Fluke 8846 6½ digit precision Multi-meter. The coating exhibited a constant current dissipation of 50 µA/ft² for 8 hours and passed the p-static test.

The test results described above demonstrate that an embodiment of the coating described herein, which included carbon nanotubes, provides good durability and ability to dissipate p-static charge and, therefore, is suitable for a variety of aerospace applications.

Although various embodiments of the disclosure have been described, additional modifications and variations will be apparent to those skilled in the art. For example, the coated substrate can have additional tie layers or primers, conductive tie layers, alternate thicknesses, additional components, etc. Also, as the individual layers included in the coated substrate are formed, they can be cleaned before the next adjacent layer is deposited. For example, the substrate can be cleaned with a solvent such as acetone, and then dried to remove any surface water, which could cause premature crosslinking of the polysiloxane of the base layer.

While the subject matter disclosed herein has been described in connection with certain embodiments, it is to be understood that the present disclosure is not limited to the disclosed embodiments, but, on the contrary, is intended to cover various modifications and equivalent arrangements included within the spirit and scope of the appended claims, and equivalents thereof. Throughout the text and claims, use of the word "about" reflects the penumbra of variation associated with measurement, significant figures, and interchangeability, all as understood by a person having ordinary skill in the art to which this disclosure pertains. Additionally, throughout this disclosure and the accompanying claims, it is understood that even those ranges that may not use the term "about" to describe the high and low values are also implicitly modified by that term, unless otherwise specified. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. §112, paragraph 6 for any limitations of any of the claims herein, except for those in which the claim expressly uses the words "means for" together with an associated function.

Although various embodiments of the present disclosure have been described in terms of "comprising" or "including," embodiments consisting essentially of or consisting of are also within the scope of the present disclosure. For example, while the present disclosure describes a carbon nanotube layer including carbon nanotubes, a carbon nanotube layer consisting essentially of or consisting of carbon nanotubes is also within the scope of the present disclosure. In this context, "consisting essentially of" means that any additional components in the carbon nanotube layer will not materially affect the conductivity, density, flexibility, light transmission, durability, sheet resistance, and/or p-static charge drain properties of the carbon nanotube layer.

As used herein, unless otherwise expressly specified, all numbers such as those expressing values, ranges, amounts or percentages may be read as if prefaced by the word "about," even if the term does not expressly appear. Any numerical range recited herein is intended to include all sub-ranges subsumed therein. Plural encompasses singular and vice versa. For example, while the present disclosure describes carbon nanotubes, a mixture of carbon nanotubes can be used. Also, as used herein, the term "polymer" is meant to refer to prepolymers, oligomers, and both homopolymers and copolymers; the prefix "poly" refers to two or more. When ranges are given, any endpoints of those ranges and/or numbers within those ranges can be combined within the scope of the present disclosure. The terms "including" and like terms mean "including but not limited to." Similarly, as used herein, the terms "on," "applied on," and "formed on" mean on, applied on, or formed on, but not necessarily in contact with the surface. For example, a coating layer "formed on" a substrate does not preclude the presence of one or more other coating layers of the same or different composition located between the formed coating layer and the substrate.

Notwithstanding that the numerical ranges and parameters set forth herein may be approximations, numerical values set forth in the specific examples are reported as precisely as is practical. Any numerical value, however, inherently contains certain errors necessarily resulting from the standard variation found in their respective testing measurements. The word "comprising" and variations thereof as used in this description and in the claims do not limit the disclosure to exclude any variants or additions.

What is claimed is:

1. A coating comprising:
    a carbon nanotube layer comprising carbon nanotubes; and
    a coating layer on the carbon nanotube layer, wherein the coating layer comprises a polyurethane polymer formed from a coating composition comprising:
        a hydrophobic first aliphatic polyisocyanate;
        a second aliphatic polyisocyanate comprising a hydrophilic portion;
        a polyester polyol;
        a hydrophilic polyol;
        a fluorinated polyol; and
        a fluorinated alcohol having one hydroxyl group.

2. The coating of claim 1, wherein the coating layer further comprises a polyacrylate polymer, a polysiloxane polymer, an epoxy polymer, or a combination thereof.

3. The coating of claim 1, wherein the carbon nanotubes are single-walled nanotubes.

4. The coating of claim 1, wherein the coating has a visible light transmittance of >80%.

5. The coating of claim 1, wherein at least a portion of the carbon nanotubes of the carbon nanotube layer are embedded in the coating layer.

6. The coating of claim 1, wherein the carbon nanotube layer and the coating layer are separate layers.

7. The coating of claim 1, wherein the coating layer has a thickness of about 1 µm to 120 µm.

8. The coating of claim 7, wherein the coating layer has a thickness of about 2 µm to 90 µm.

9. The coating layer of claim 1, wherein the carbon nanotube layer has a thickness of about 1 nm to 15 nm.

10. The coating of claim 1, wherein the carbon nanotube layer is formed from a carbon nanotube coating composition comprising the carbon nanotubes in an amount of 0.01 wt % to 2 wt % based on the total weight of the carbon nanotube coating composition.

11. The coating of claim 1, wherein the coating has a thickness of about 1 µm to 140 µm.

12. The coating of claim 1, wherein the carbon nanotube layer consists essentially of carbon nanotubes.

13. The coating of claim 1, wherein the coating layer comprises a conductive agent.

14. A coated substrate comprising:
   a substrate; and
   the coating of claim 1 on the substrate.

15. The coated substrate of claim 14, further comprising a tie layer between the substrate and the coating.

16. The coated substrate of claim 15, wherein at least a portion of the coating layer permeates the carbon nanotube layer and is adhered to the tie layer.

17. The coated substrate of claim 15, wherein the tie layer comprises a polyurethane polymer, a polyacrylate polymer, a polysiloxane polymer, an epoxy polymer, or a combination thereof.

18. The coated substrate of claim 14, wherein the coated substrate has a visible light transmittance >80%.

19. A vehicle comprising the coated substrate of claim 14.

* * * * *